United States Patent
Tomoeda et al.

(10) Patent No.: US 7,050,336 B2
(45) Date of Patent: May 23, 2006

(54) NONVOLATILE SEMICONDUCTOR MEMORY DEVICE HAVING REDUCED ERASING TIME

(75) Inventors: Mitsuhiro Tomoeda, Hyogo (JP); Minoru Nakamura, Hyogo (JP)

(73) Assignees: Renesas Technology Corp., Tokyo (JP); Renesas Devices Design Corp., Hyogo (JP)

( * ) Notice: Subject to any disclaimer, the term of this patent is extended or adjusted under 35 U.S.C. 154(b) by 39 days.

(21) Appl. No.: 10/930,806

(22) Filed: Sep. 1, 2004

(65) Prior Publication Data

US 2005/0052908 A1    Mar. 10, 2005

(30) Foreign Application Priority Data

Sep. 4, 2003  (JP)  .............................. 2003-312905

(51) Int. Cl.
*G11C 11/34* (2006.01)
*G11C 16/06* (2006.01)

(52) U.S. Cl. .............................. 365/185.29; 365/185.3; 365/185.18; 365/185.19; 365/185.22; 365/185.24; 365/185.11; 365/218

(58) Field of Classification Search ........... 365/185.29, 365/185.3, 185.18, 185.19, 185.22, 185.24, 365/185.11, 218

See application file for complete search history.

(56) References Cited

U.S. PATENT DOCUMENTS

| | | | | |
|---|---|---|---|---|
| 5,844,841 A * | 12/1998 | Takeuchi et al. | ....... | 365/185.03 |
| 6,064,591 A * | 5/2000 | Takeuchi et al. | ....... | 365/185.03 |
| 6,091,640 A * | 7/2000 | Kawahara et al. | ..... | 365/185.28 |
| 6,134,148 A * | 10/2000 | Kawahara et al. | ..... | 365/185.28 |
| 6,163,485 A * | 12/2000 | Kawahara et al. | ..... | 365/185.24 |
| 6,285,597 B1 * | 9/2001 | Kawahara et al. | ..... | 365/185.24 |
| 6,442,070 B1 * | 8/2002 | Tanaka et al. | ......... | 365/185.22 |
| 6,459,621 B1 * | 10/2002 | Kawahara et al. | ..... | 365/185.24 |
| 6,496,418 B1 * | 12/2002 | Kawahara et al. | ..... | 365/185.24 |
| 6,542,410 B1 * | 4/2003 | Hirano | .................... | 365/185.3 |
| 6,747,902 B1 * | 6/2004 | Seki et al. | ............. | 365/185.29 |
| 2001/0000023 A1* | 3/2001 | Kawahara et al. | ..... | 365/185.24 |

FOREIGN PATENT DOCUMENTS

| | | |
|---|---|---|
| JP | 3-105795 | 5/1991 |
| JP | 9-63287 | 7/1997 |
| JP | 2001-126489 | 5/2001 |

\* cited by examiner

*Primary Examiner*—Viet Q. Nguyen
(74) *Attorney, Agent, or Firm*—McDermott Will & Emery LLP

(57) ABSTRACT

An operation of erasing data in a memory block of a nonvolatile semiconductor memory device employs an operation of collectively applying an erase pulse to the memory block, and an operation of collectively applying an erase pulse to a limited region in the memory block. Thereby, the number of the erase pulses excessively applied to the memory cells, which passed verify, can be reduced as compared with a conventional structure so that the number of the memory cells to be subjected to over-erase recovery write decreases, and the total block erase time can be short.

13 Claims, 25 Drawing Sheets

NONVOLATILE SEMICONDUCTOR MEMORY DEVICE HAVING REDUCED ERASING TIME

BACKGROUND OF THE INVENTION

1. Field of the Invention

The present invention relates to a nonvolatile semiconductor memory device, and particularly to a flash memory having a variable range, in which erasing or writing is performed.

2. Description of the Background Art

A flash memory is a kind of nonvolatile memories (EEPROM) allowing electrical rewriting, and particularly is a memory allowing collective erasing of multiple memory cells. Flash memories of large capacities have been available in recent years, and in many case, such flash memories have employed a block erasing manner, in which a memory array is divided into a plurality of blocks, and collective erasing is performed block by block.

FIG. 22 is a flowchart illustrating an operation of block erasing of a conventional flash memory.

FIG. 23 is a circuit diagram of a memory block.

For the sake of simplicity, FIG. 23 shows memory cells arranged in four rows and four columns in the memory block. Each memory cell includes a memory transistor, which can nonvolatilely store data by changing its threshold voltage. The memory transistor has a floating gate, and electrons are injected into the floating gate or are pulled out from the floating gate so that the threshold voltage changes. The memory transistor thus configured will be simply referred to as a "memory cell" hereinafter.

Referring to FIGS. 22 and 23, when the block erasing starts, pre-erase writing is performed in a step S501.

FIG. 24 shows a distribution of threshold voltages of the memory cells exhibited after the pre-erase writing.

Before the erasing, some of the memory cells in the memory block usually have data of "1", and the others have data of "0". Therefore, if the erasing operation is performed in this state, many memory cells are over-erased. When the pre-erase writing is performed, the distribution of threshold voltages of the memory cells in the memory block shifts toward a high-voltage side, as shown in FIG. 24.

After step S501 in FIG. 22, operations are performed in subsequent steps S502 and S503 to set the memory block to a first erased state. More specifically, reading from the respective memory cells is performed while changing the row and column addresses, and erase verify 1 in step S502 is performed to determine whether the memory cell is in the erased state or not.

Every time it is determined in step S502 that the memory cell is not in the erased state, an erase pulse is applied collectively to the memory block at a time in step S503.

For the sake of distinction, the erase pulse, which is applied in step S503 for achieving the first erased state, will be referred to as an "erase pulse 1" in the following description, and a pulse applied in a later step S507 for achieving a second erased state will be referred to as an "erase pulse 2", hereinafter. Also, in connection with the erase pulses 1 and 2, verify for verifying the first erased state will be referred to as "erase verify 1", and verify for verifying the second erased state will be referred to as "erase verify 2", hereinafter.

As shown in FIG. 23, application of the erase pulse in step S503 is performed by setting predetermined voltages on word lines, bit lines and a source line. More specifically, all word lines WL0–WL3 are set to a negative voltage, e.g., of −10 V., and all bit lines BL0–BL3 are set to an open state. Also, A source line SL is set to a positive voltage, e.g., of +10 V. By setting the voltages as described above, the erase pulse, which can act to lower the threshold voltage, is applied collectively to all the memory cells in the memory block at a time.

FIG. 25 shows voltages applied to a memory transistor when the erase pulse is applied.

Referring to FIG. 25, a negative voltage, e.g., of −10 V is applied to a control gate connected to a word line. A positive voltage, e.g., of +10 V is applied to a P-well and a source. This source is connected to source line SL. A drain of the memory transistor is open. This drain is connected to a bit line. An N-well, in which a P-well is formed, is set to a positive voltage, e.g., of +10 V. Since the erase pulse is applied, electrons are pulled out from the floating gate by a tunneling phenomenon so that a threshold voltage Vth lowers.

FIG. 26 shows a distribution of the threshold voltages exhibited after application of the erase pulse 1.

Referring to FIGS. 22 and 26, after the erasing operation is completed in steps S502 and S503, the distribution of threshold voltages of the memory cells in the memory block is located in a region lower than a verify voltage Vth1. However, immediately after passing the erase verify 1 in step S502, over-erasing may occur, and thus a lower end of the threshold voltage distribution may enter a region of the threshold voltage lower than 0 V. Therefore, processing of soft collective write verify and application of a soft collective write pulse are performed in steps S504 and S505, respectively. The write pulse, which is applied in step S505 and is weaker than that in an ordinary write operation, is referred to as the soft collective write pulse.

FIG. 27 shows a state of voltages applied in the memory cell when the soft collective write pulse is applied.

Referring to FIG. 27, a positive voltage, e.g., of +10 V is placed on the control gate connected to the word line. A negative voltage, e.g., of −5 V is placed on the source connected to source line SL and the P-well, in which the memory transistor is formed. The drain connected to the bit line is open. A power supply voltage Vdd is placed on the N-well located under the P-well. The tunneling phenomenon injects electrons into the floating gate to raise threshold voltage Vth.

FIG. 28 shows a distribution of the threshold voltages exhibited immediately after the soft collective write verify is completed.

Referring to FIGS. 22 and 28, the soft collective write pulse is applied collectively to the memory block in step S505. This shifts a lower limit value of the threshold voltage distribution of the memory cell. A soft write pulse is applied collectively to all the memory cells in the memory block at a time so that the lower limit value of the threshold voltage distribution of the memory cells may be equal to or higher than a verify voltage Vth2. When the lower limit value of the threshold voltage distribution of the memory cells becomes equal to or higher than verify voltage Vth2, the soft collective write verify in step S504 is passed.

When the soft collective write verify in step S504 is passed, some bits may exhibit a distribution protruding beyond the upper limit of the threshold voltage distribution. For returning such protruding threshold voltages of the bits to the erased state, the erase pulse 2 is applied again to the memory block in steps S506 and S507.

Application of the erase pulse 2 is repeated in steps S506 and S507 until the whole distribution of threshold voltages of the memory cells becomes equal to or lower than a predetermined upper limit voltage Vth3. This application of the erase pulse 2 in step S507 is performed by applying the pulse to all the memory cells in the block at a time, similarly to step S503.

FIG. 29 shows a distribution of the threshold voltages exhibited after completion of the erase verify 2 in step S506.

By applying the erase pulse 2 after the soft collective writing, the threshold voltage not exceeding verify voltage Vth3 is achieved even for the bit previously exhibiting the protruded portion of the distribution.

When the erase verify 2 is finally completed in step S506, over-erase recovery is effected on the over-erased memory cells on a bit-by-bit basis in subsequent steps S508 and S509.

FIG. 30 shows a distribution of threshold voltages of the memory cells exhibited after the over-erase verify in step S508 is completed.

When it is determined from the reading in step S508 that the memory is over-erased, a write pulse is applied to one of the memory cells, which are determined as the over-erased memory cells, in step S509. As a result of repeating of steps S508 and S509, the write pulse is applied only to the memory cells having the threshold voltages lower than a verify voltage Vth4, and the threshold voltage of the memory cell supplied with the write pulse shifts toward a high-voltage side.

By performing the processing in accordance with the flow illustrated in FIG. 22, the distribution of threshold voltages of the memory cells in the memory block are kept between the set voltage values of the lower and upper limits of the threshold voltage. Thereby, the collective block erasing operation is completed.

As described above, even when the same write pulse and the same erase pulse are applied, the threshold voltages of the memory cells exhibit a wide distribution due to variations in characteristics of the memory cells. Therefore, collective application of the write pulse and erase pulse to the block is repeated multiple times while changing the pulse intensity, and finally the writing is effected on the over-erased memory cells bit by bit. In first and subsequent some operations, the pulse is applied collectively to all the memory cells for the purpose of reducing the total times of required pulse application. If the writing were effected bit by bit even in the first and subsequent some operations, this would increase the times of pulse application, and would increase the erasing time.

As a prior art related to the collective erasing of the nonvolatile semiconductor memory device, Japanese Patent Laying-Open No. 03-105795 has disclosed a technique for achieving various types of partial erasing including collective erasing of the memory array.

In a prior art, application of the erase pulse 2 after the soft collective writing is performed a block at a time. More specifically, the erase pulse 2 is applied every time the erase verify is failed. The erase verify is performed to determine the pass/fail of data by reading data of one, eight or sixteen bit(s) at a time while successively incrementing both the row and column addresses. For example, in the case of the memory block formed of 16 memory cells shown in FIG. 23, reading from the memory cell is performed a memory cell at a time, and the determination of pass/fail is performed a memory cell at a time.

Therefore, even when a region corresponding to a "small" row address and a "small" column address passes the verify, the erase pulse 2 will be applied to this region if it fails the verify of a region corresponding to a higher address, at which the verify is performed later.

Consequently, the region, which already passed the verify, will be excessively supplied with the erase pulse until the threshold voltage of all the memory cells in the block to be erased lowers to or below the erase verify voltage. Thereby, the threshold voltages of the memory cells, which excessively received the erase pulse, become lower than the lower limit of the allowable distribution so that the number of over-erased memory cells increases. Since the memory cells, which are to be processed by the over-erase recovery writing, increase in number, the erase time increases.

SUMMARY OF THE INVENTION

An object of the invention is to provide a nonvolatile semiconductor memory device having a reduced erase time.

In summary, the invention provides a nonvolatile semiconductor memory device including a memory block including a plurality of memory transistors arranged in rows and columns, and each having a control gate and a floating gate, a plurality of word lines arranged corresponding to the rows of the plurality of memory transistors, respectively, and a plurality of bit lines arranged corresponding to the columns of the plurality of memory cells, respectively; a select circuit selecting an application target of an erase pulse in the memory block; and a write erase control portion controlling data erasing in the memory block when information held by the memory block is to be collectively erased. The collective erasing provides states including a first erased state attained at a midpoint in a course of the collective erasing, and a second erased state attained after the first erased state. The first and second erased states exhibit a distribution of threshold voltages of the plurality of memory transistors lower than predetermined first and second threshold voltages, respectively. The write erase control portion instructs the select circuit to select collectively the memory transistors in the memory block for repetitively applying a first erase pulse until the memory block enters the first erased state, to perform selection such that a write pulse weaker than a write pulse for usual writing is applied to the memory transistors in the memory block after the memory block enters the first erased state, and to perform selection such that the memory block is divided into a plurality of regions, and the regions are successively selected to apply a second erase pulse collectively to each of the regions until the memory block enters the second erased state.

According to another aspect of the invention, a nonvolatile semiconductor memory device includes a memory block including a plurality of memory transistors arranged in rows and columns, and each having a control gate and a floating gate, a plurality of word lines arranged corresponding to the rows of the plurality of memory transistors, respectively, and a plurality of bit lines arranged corresponding to the columns of the plurality of memory cells, respectively; a select circuit selecting an application target of an erase pulse in the memory block; and a write erase control portion controlling data erasing in the memory block when information held by the memory block is to be collectively erased. The collective erasing provides states including a first erased state attained at a midpoint in a course of the collective erasing, and a second erased state attained after the first erased state. The first and second erased states exhibit a distribution of threshold voltages of the plurality of memory transistors lower than predetermined first and second threshold voltages, respectively. A first written state exhibits the distribution of the threshold voltages of the plurality of memory cells exceeding a predetermined threshold voltage lower than the first threshold voltage. The write erase control portion instructs the select circuit to select collectively the memory transistors in the memory block for repetitively applying a first erase pulse until the memory block enters the first erased state, instructs to divide the memory block into a plurality of regions and to select successively the respective regions for applying a write pulse weaker than a write pulse for usual writing collectively to each of the regions after the memory block enters the first erased state, and instructs to select collectively the memory transistors in the memory block for applying a second erase pulse to the memory block until the memory block enters the second erased state.

For erasing the data in the memory block, the invention employs the operation of applying the erase pulse collectively to the memory block until the first erased state is attained as well as the operation of applying the erase pulse collectively to a partial region of the memory block until the second erased state is attained. Thereby, it is possible to reduce the number of erase pulses applied excessively to the memory cells, which have passed the verify, as compared with a conventional manner, so that it is possible to reduce the number of memory cells to be subjected to the over-erase recovery writing, and therefore to reduce the total block erasing time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the following description, the same or corresponding portions bear the same reference numbers.

[First Embodiment]

Figure 1:
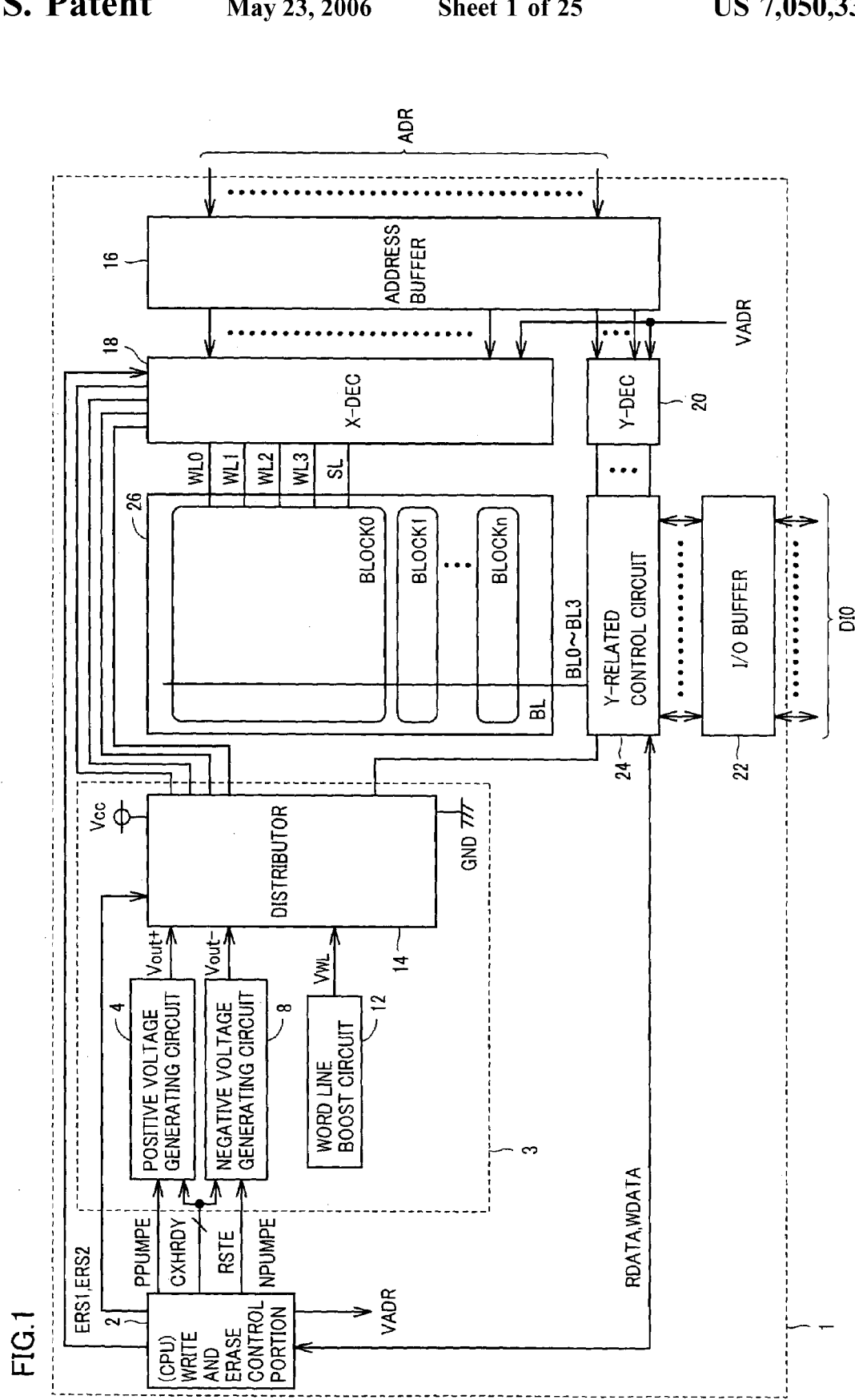
FIG. 1 is a schematic block diagram showing a structure of a nonvolatile semiconductor memory device of a first embodiment of the invention.

FIG. 1 is a schematic block diagram showing a structure of a nonvolatile semiconductor memory device according to a first embodiment of the invention.

Referring to FIG. 1, nonvolatile semiconductor memory device 1 includes a write and erase control portion 2, which is provided with a ROM, and controls writing and erasing according to program codes held in this ROM, a voltage generating portion 3, which receives a standby signal CXHRDY, a charge pump activating signal PPUMPE and a reset signal RSTE from write and erase control portion 2, and issues output potentials Vout+, Vout– and $V_{WL}$ according to these received signals, an address buffer 16 receiving an externally applied address signal ADR, an X-decoder 18, which receives an internal address signal sent from address buffer 16 and a potential supplied from voltage generating portion 3, and decides respective potentials of word lines WL0 and WL1, a source line SL and a well, an I/O buffer 22 transmitting a data I/O signal DIO, a Y-decoder 20 receiving and decoding the address signal sent from address buffer 16, and a Y-related control circuit 24, which applies a high voltage to a bit line BL corresponding to the data I/O signal in accordance with the output of Y-decoder 20.

Voltage generating portion 3 includes a positive voltage generating circuit 4, which receive standby signal CXHRDY, charge pump activating signal PPUMPE and reset signal RSTE from write and erase control portion 2, and generates output potential Vout+ in accordance with these received signals, a negative voltage generating circuit 8, which receives standby signal CXHRDY, reset signal RSTE and a charge pump activating signal NPUMPE, and generates output potential Vout−, a word line boost circuit 12 generating a word line potential $V_{WL}$, and a distributor 14, which receives output potentials Vout+ and Vout− as well as word line potential $V_{WL}$, and distributes them to various internal circuits under the control of write and erase control portion 2.

Although not shown, X-decoder 18 includes a word line decoder for selecting a word line, a well decoder for selecting a well region corresponding to the selected memory block, and an SL decoder for selecting a source line.

Although not shown, Y-related control circuit 24 includes a YG and sense amplifier and a latch circuit, which operate in a read operation to perform column selection and reading by a sense amplifier. Y-related control circuit 24 also includes a page buffer for determining based on latched data whether a predetermined potential is to be applied to bit line BL or not.

Word line boost circuit 12 is a circuit for generating a boosted potential to be applied to word line WL selected in a read operation for achieving fast access.

Nonvolatile semiconductor memory device 1 further includes a memory array 26. Memory array 26 includes memory blocks BLOCK0–BLOCKn, which are formed in wells isolated from each other, respectively.

Write and erase control portion 2 issues control signals ERS1 and ERS2, which are used for block erasing, to X-decoder 18. Write and erase control portion 2 issues an address signal VADR to be used for verifying to X-decoder 18 and Y-decoder 20. In the verify operation, write and erase control portion 2 receives read data RDATA from Y-related control circuit 24, and applies data WDATA, which is rewrite data or erase data, to Y-related control circuit 24.

Figure 2:
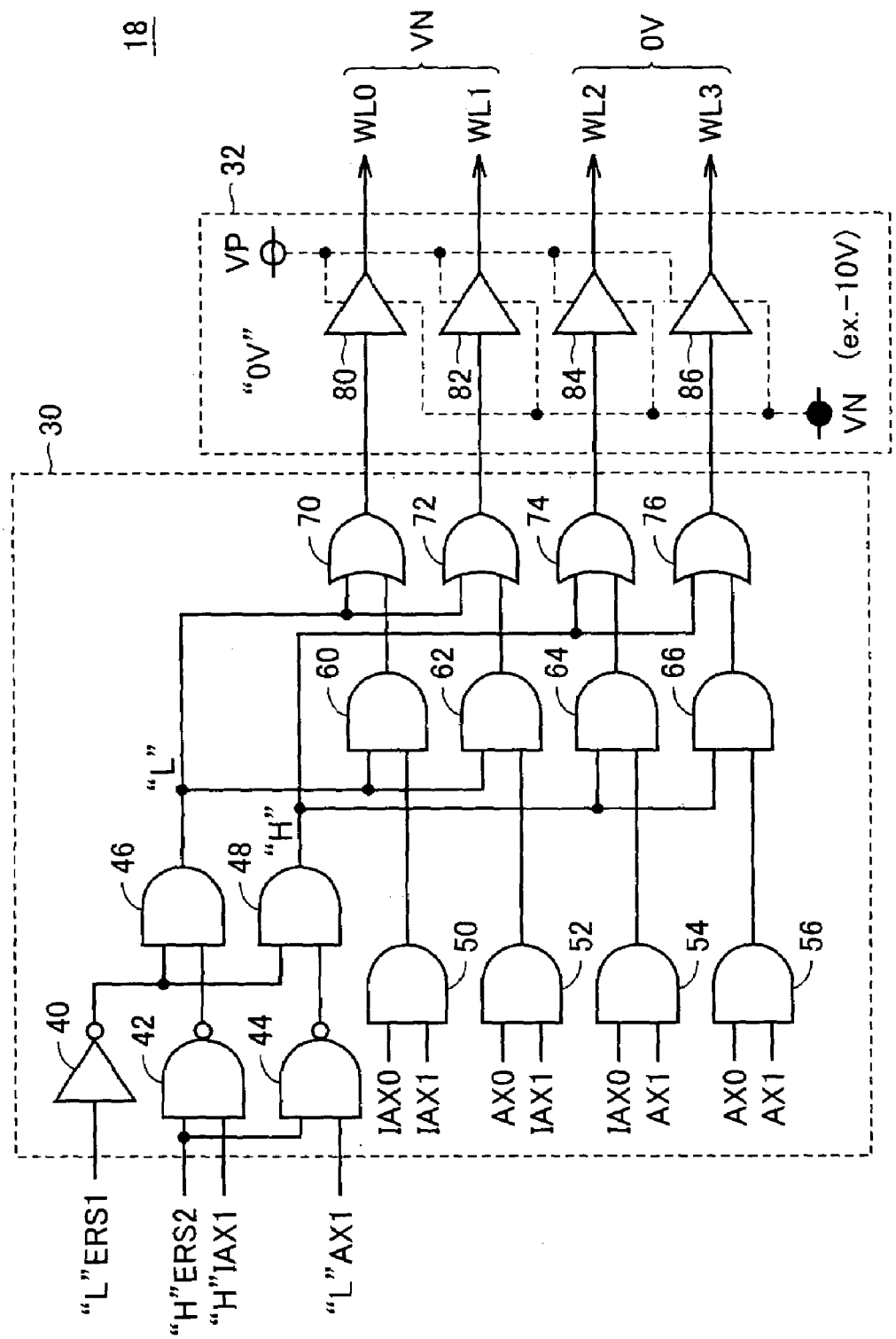
FIG. 2 is a circuit diagram showing a structure of an X-decoder 18 in FIG. 1.

FIG. 2 is a circuit diagram showing a structure of X-decoder 18 in FIG. 1.

Referring to FIG. 2, X-decoder 18 includes a select portion 30 selecting the word line in accordance with control signals ERS1 and ERS2, address signals AX0 and AX1, and inverted signals IAX0 and IAX1 thereof, and a word line driver 32 driving word lines WL0–WL3 in accordance with an output of select portion 30.

Select portion 30 includes an inverter 40 receiving and inverting control signal ERS1, a NAND circuit 42 receiving control signals ERS2 and IAX1, a NAND circuit 44 receiving control signal ERS2 and signal AX1, an AND circuit 46 receiving outputs of inverter 40 and NAND circuit 42, and an AND circuit 48 receiving outputs of inverter 40 and NAND circuit 44.

Select portion 30 further includes an AND circuit 50 receiving signals IAX0 and IAX1, an AND circuit 52 receiving signals AX0 and IAX1, an AND circuit 54 receiving signals IAX0 and AX1, and an AND circuit 56 receiving signals AX0 and AX1.

Select portion 30 further includes an AND circuit 60 receiving outputs of AND circuits 46 and 50, an AND circuit 62 receiving outputs of AND circuits 46 and 52, an AND circuit 64 receiving outputs of AND circuits 48 and 54, and an AND circuit 66 receiving outputs of AND circuits 48 and 56.

Select portion 30 further includes an OR circuit 70 receiving outputs of AND circuits 46 and 60, an OR circuit 72 receiving outputs of AND circuits 46 and 62, an OR circuit 74 receiving outputs of AND circuits 48 and 64, and an OR circuit 76 receiving outputs of AND circuit 48 and 66.

Word line driver 32 includes a drive circuit 80 driving word line WL0 in accordance with an output of OR circuit 70, a drive circuit 82 driving word line WL1 in accordance with an output of OR circuit 72, a drive circuit 84 driving word line WL2 in accordance with an output of OR circuit 74, and a drive circuit 86 driving word line WL3 in accordance with an output of OR circuit 76. Drive circuits 80–86 are supplied with potentials VP and VN serving as drive potentials from distributor 14 shown in FIG. 1.

A conventional X-decoder can individually select one of the word lines in the block, or can collectively select all the word lines in the block at a time. However, X-decoder 18 shown in FIG. 2 can set word lines WL0 and WL1 to −10 V, and can set word lines WL2 and WL3 to 0 V, for example, when potential VP is set to 0 V, and potential VN is set to a negative potential of −10 V during an operation of applying the erase pulse.

Figure 3:
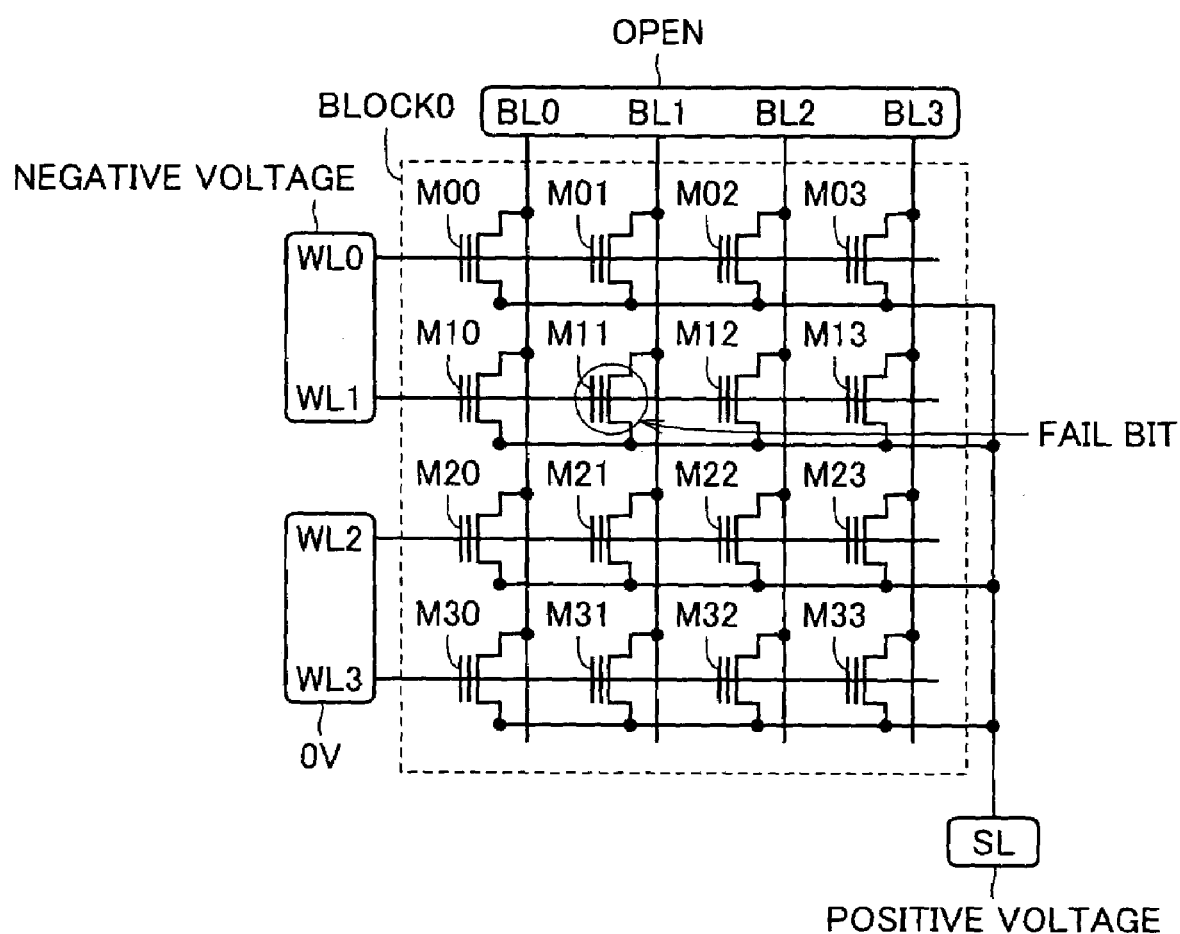
FIG. 3 is a circuit diagram showing a structure of a memory block BLOCK0 in FIG. 1.

FIG. 3 is a circuit diagram showing a structure of memory block BLOCK0 in FIG. 1.

Referring to FIG. 3, memory block BLOCK0 includes memory transistors M00, M10, M20 and M30, which are connected between bit line BL0 and source line SL, and have gates connected to word lines WL0, WL1, WL2 and WL3, respectively, and memory transistors M01, M11, M21 and M31, which are connected between bit line BL1 and source line SL, and have gates connected to word lines WL0, WL1, WL2 and WL3, respectively.

Memory block BL0CK0 further includes memory transistors M02, M12, M22 and M32, which are connected between bit line BL2 and source line SL, and have gates connected to word lines WL0, WL1, WL2 and WL3, respectively, and memory transistors M03, M13, M23 and M33, which are connected between bit line BL3 and source line SL, and have gates connected to word lines WL0, WL1, WL2 and WL3, respectively.

For the sake of illustration, FIG. 3 shows, by way of example, the memory block having the memory transistors arranged in four rows and four columns. In practice, however, the memory block includes word lines, bit lines and memory transistors more than those shown in FIG. 3.

Figure 4:
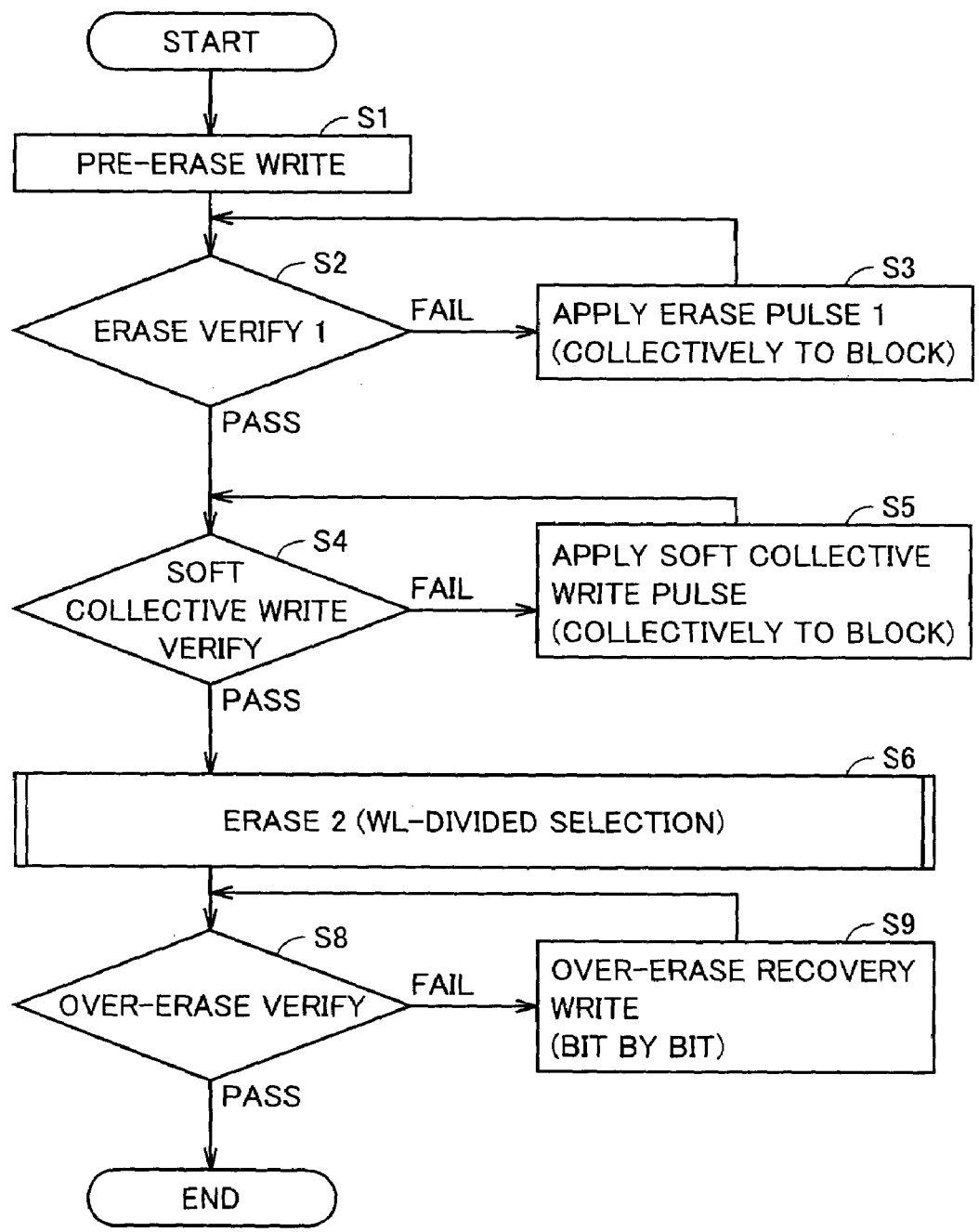
FIG. 4 is a flowchart for illustrating a block erasing operation of the first embodiment.

FIG. 4 is a flowchart for illustrating a block erasing operation of the first embodiment.

Referring to FIG. 4, the block erasing operation of the first embodiment is performed in the same manner as the conventional operation until the soft collective write operation is performed. However, in the second erasing operation, the word line selection is performed to select only half the word lines selected in the usual block collective selection, as will be described later. Instead of the division into halves, the word lines may be divided into groups each including ¼ or ⅛ of the word lines for selection.

Description will now be given with reference to a flowchart.

When a block erasing command is supplied, pre-erase writing is performed in a step S1.

Figure 24:
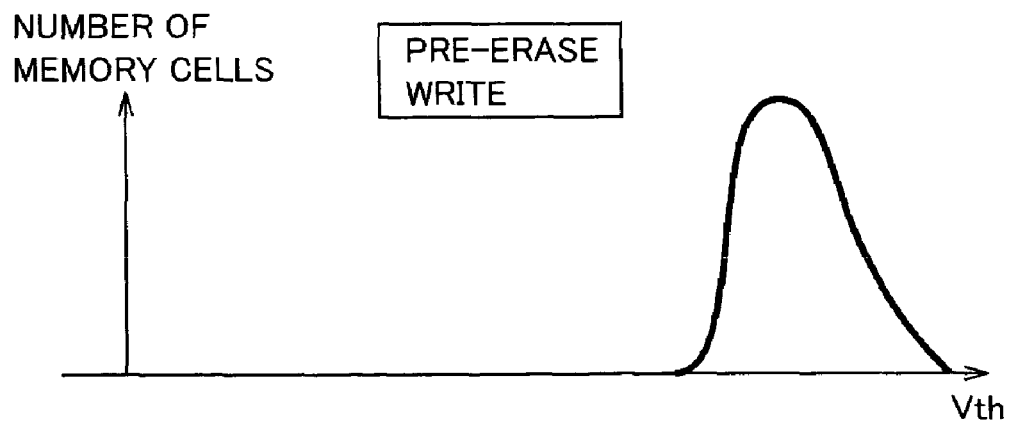
FIG. 24 shows a distribution of threshold voltages of memory cells exhibited after pre-erase writing.
Figure 25:
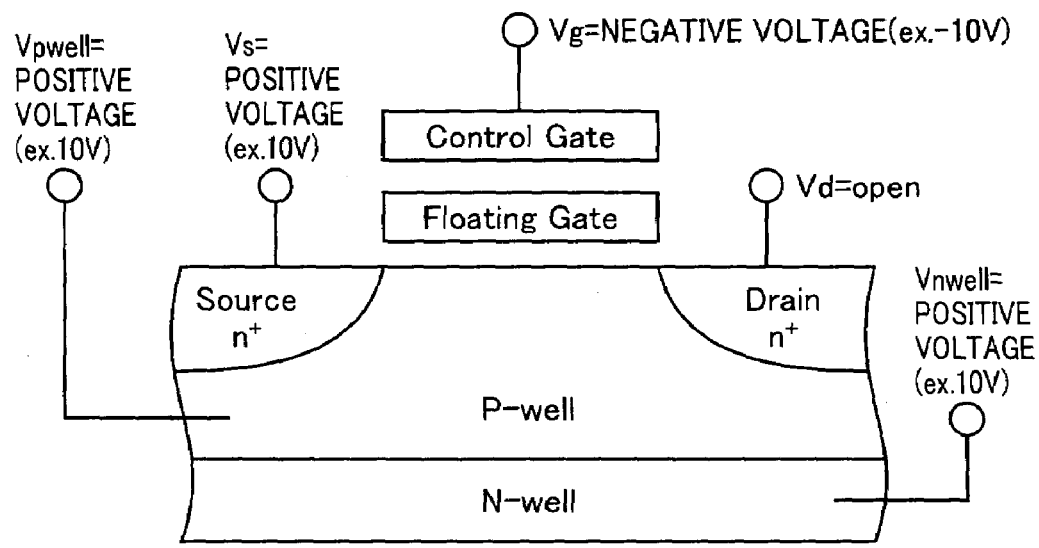
FIG. 25 shows voltages applied in a memory transistor when an erase pulse is applied.

Before the erasing, data held in the memory cells of the memory block are usually irregular, and include data of 1 and data of 0. If the erasing operation is performed in this state, some or many memory cells will be over-erased. As already illustrated in FIG. 24, when the pre-erase writing is performed, the distribution of threshold voltages of the memory cells in the memory block shifts toward the higher side of the voltage.

After step S1 ends, an operation of setting the memory block to the first erased state is performed in steps S2 and S3. More specifically, reading from the respective memory transistors is performed while changing the row address and the column address, and the erase verify 1 is performed in step S2 to determine whether the memory cell is in the erased state or not.

Whenever it is determined in step S2 that the memory cell is not yet erased, the erase pulse is applied collectively to the memory block in step S3. For the sake of distinction, the erase pulse applied in step S3 will be referred to as an "erase pulse 1", and an erase pulse applied in a later step S6 will be referred to as an "erase pulse 2", hereinafter.

Figure 23:
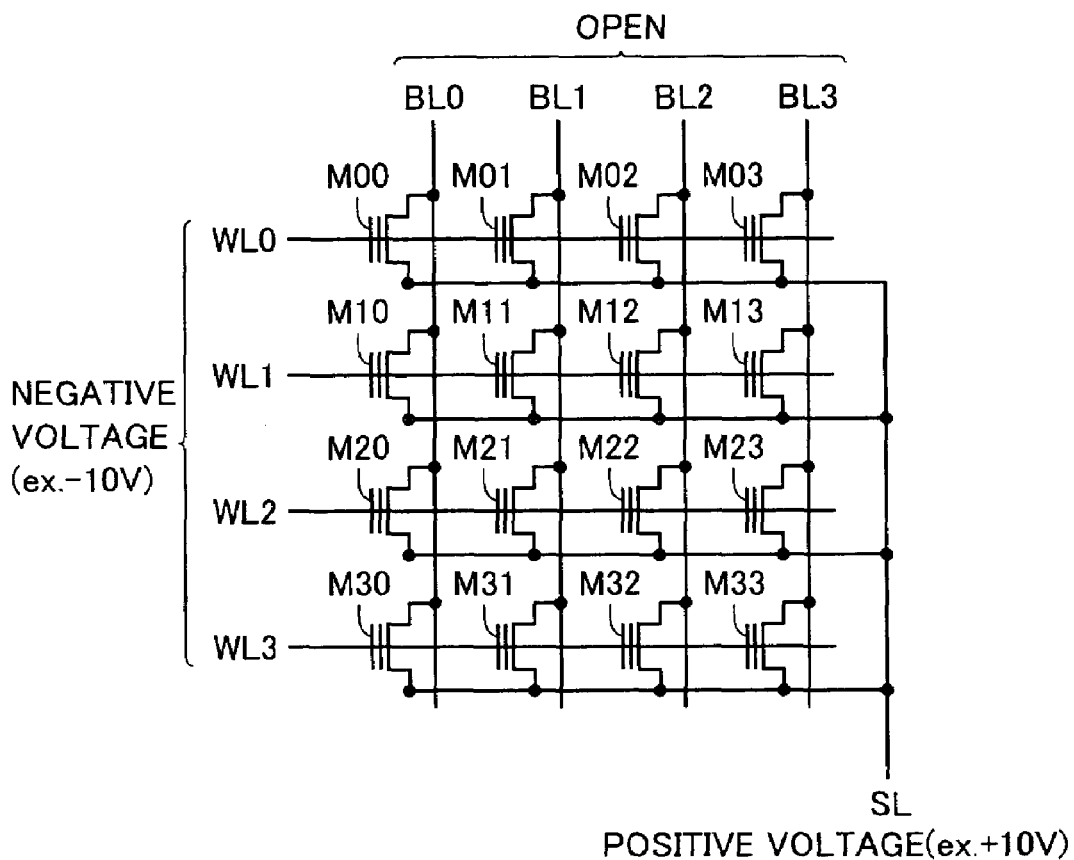
FIG. 23 is a circuit diagram showing a memory block.

As already shown in FIG. 23, application of the erase pulse in step S3 is performed by setting the word lines, bit lines and source line to predetermined voltages. More specifically, all word lines WL0–WL3 are set to a negative voltage, e.g., of −10 V, all bit lines BL0–BL3 are set to the open state, and source line SL is set to a positive voltage, e.g., of +10 V.

In step S3, signals ERS1 and ERS2 are set to H- and L-levels in X-decoder 18 shown in FIG. 2, respectively. Thereby, all the input levels of the word line drivers attain the L-level independently of the address of the erase verify 1 performed in step S2. In this state, a power supply potential VP of the word line driver is set to 0 V, and power supply potential VN is set to a negative potential of −10 V. By selecting the word line as described above, the negative voltage is applied to all word lines WL0–WL3 in the block, and the erase pulse is applied collectively to the memory transistors included in the memory block.

By setting the voltages as described above, the erase pulse, which can act to lower the threshold voltage, is collectively applied to all the memory cells in the memory block. Owing to the application of the erase pulse, the tunneling phenomenon pulls out the electrons from the floating gate so that a threshold voltage Vth lowers.

When the erasing operation ends in steps S2 and S3, the distribution of threshold voltages of the memory cells in the memory block shifts to a region lower than a verify voltage Vth1. However, a first erased state, which is attained immediately after passing of the erase verify 1 in step S2, is an erased state at a midpoint in the course of the collective erasing of the memory block. More specifically, a lower end of the threshold voltage distribution may protrude into a region of the over-erased state, i.e., a region of the threshold voltage lower not exceeding 0 V. Therefore, soft collective write verify and soft collective write pulse application are performed in steps S4 and S5, respectively. A write pulse, which is applied in step S5 and is weaker than that in an ordinary write operation, is referred to as the "soft collective write pulse". This weak write pulse is a pulse having a pulse voltage smaller in absolute value than that in the ordinary write operation, is a pulse having a shorter pulse width than that in the ordinary write operation, or is a pulse having a smaller pulse voltage and a shorter pulse width than those in the ordinary write operation.

During application of the soft collective write pulse, a positive voltage, e.g., of +10 V is applied to a control gate connected to the word line. The source connected to source line SL and the P-well provided with the memory transistor are set to a negative voltage, e.g., of −5 V. The drain connected to the bit line is set to the open state. The N-well located under the P-well is supplied with a power supply voltage Vdd. By applying the voltages as described above, the tunneling phenomenon injects electrons into the floating gate to raise threshold voltage Vth.

Figure 28:
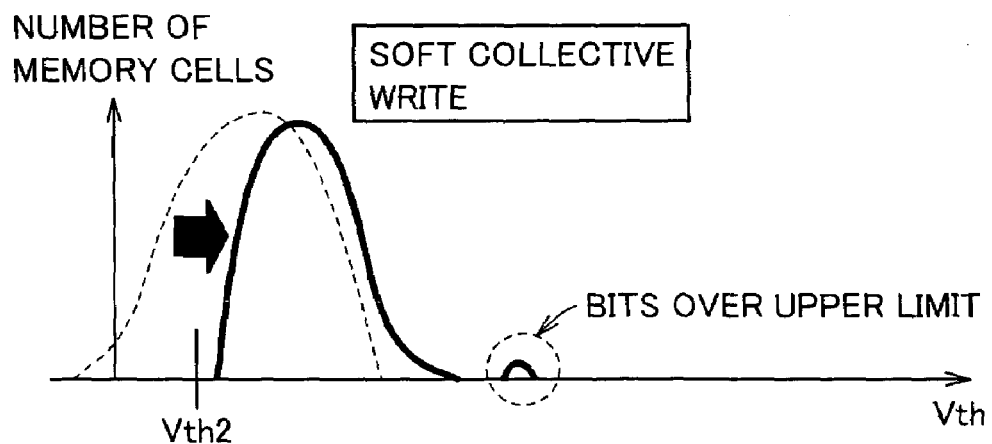
FIG. 28 shows a distribution of threshold voltages exhibited immediately after soft collective write verify is completed.
Figure 29:
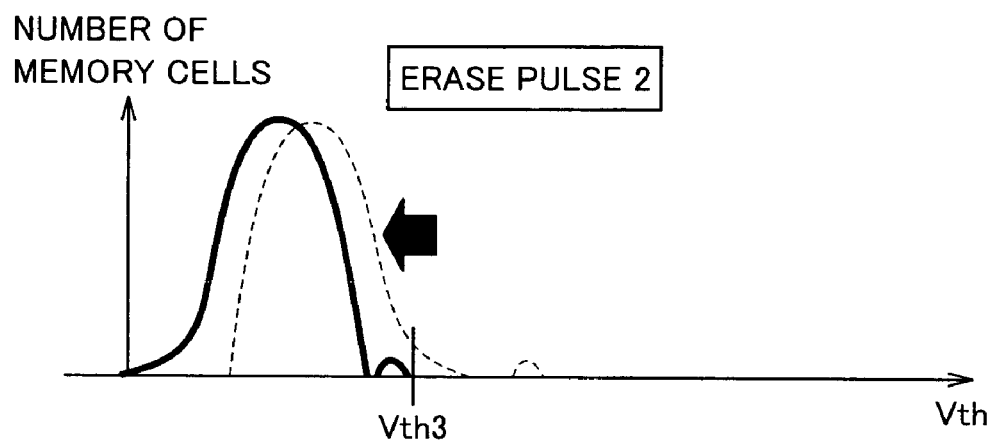
FIG. 29 shows a distribution of threshold voltages exhibited after completion of erase verify 2 in a step S506.

When the soft collective write pulse is applied collectively to the memory block in step S5, this shifts the lower limit value of the threshold voltage distribution of the memory cells as already illustrated in FIG. 28. The soft write pulse is applied collectively to all the memory cells in the memory block so that the lower limit value of the threshold voltage distribution of the memory cells becomes equal to or below a verify voltage Vth2. When the lower limit value of the threshold voltage distribution of the memory cells becomes equal to or below verify voltage Vth2, the soft collective write verify in step S4 is passed.

When the soft collective write verify is passed in step S4, such bits may exist that conversely protrude toward the higher side of the threshold voltage distribution. For returning the threshold voltages of the protruding bits on the higher side to the erased state, processing of "erase 2" is performed in step S6.

In step S6, an operation of applying the erase pulse 2 is performed. For application of the erase pulse 2, the word lines in the memory block are not collectively selected, but are divided for selection. As will be described later in detail, the word lines, which are collectively selected at a time, are only half the total word lines in the memory block.

Also, the voltage of the erase pulse 2 may be lower than that of the erase pulse 1, or the pulse width of the erase pulse 2 may be shorter than that of the erase pulse 1. Thereby, the over-erasing can be further suppressed.

By applying the erase pulse 2 after the soft collective writing, the threshold voltage for the bit forming a protruded portion of the distribution has the threshold voltage not exceeding a verify voltage Vth3. For rapidly completing the erasing operation, it is preferable that verify voltage Vth3 is higher in absolute value than verify voltage Vth1. In this case, a second erased state, which is attained in the memory array attained after completion of step S6, is achieved during the process of the collective erasing and particularly after the first erased state attained immediately after passing in step S2.

When the second erasing operation is completed in step S6, the operation moves to a step S8.

After the erase 2 is completed in step S6, over-erase recovery writing is effected on the over-erased memory cells bit by bit in subsequent steps S8 and S9.

Figure 30:
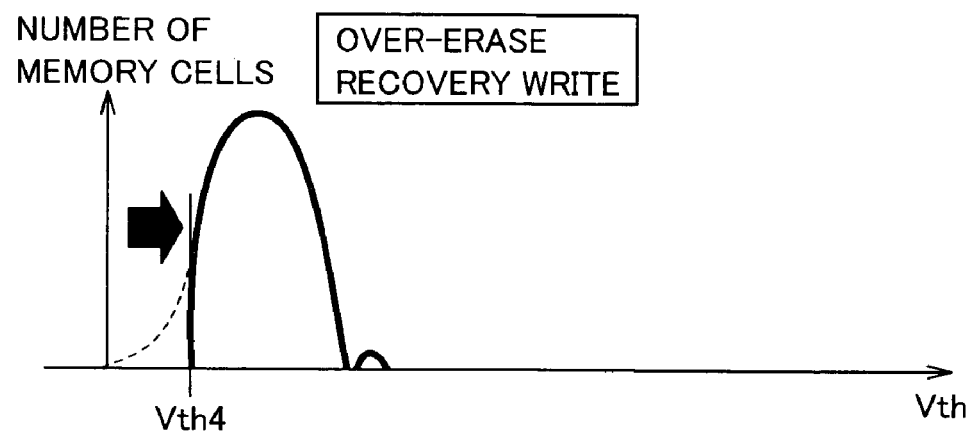
FIG. 30 shows a distribution of threshold voltages of memory cells exhibited after completion of over-erase verify in a step S508.

When it is determined as a result of the reading in step S8 that the memory cell is over-erased, the write pulse is applied in step S9 to the one memory cell, which is determined as the over-erased memory cell. Steps S8 and S9 are repeated so that the write pulse is applied only to the memory cells having the threshold voltages lower than a verify voltage Vth4 as already shown in FIG. 30, and the threshold voltage of the memory cell supplied with the write pulse shifts to a larger side.

Figure 5:
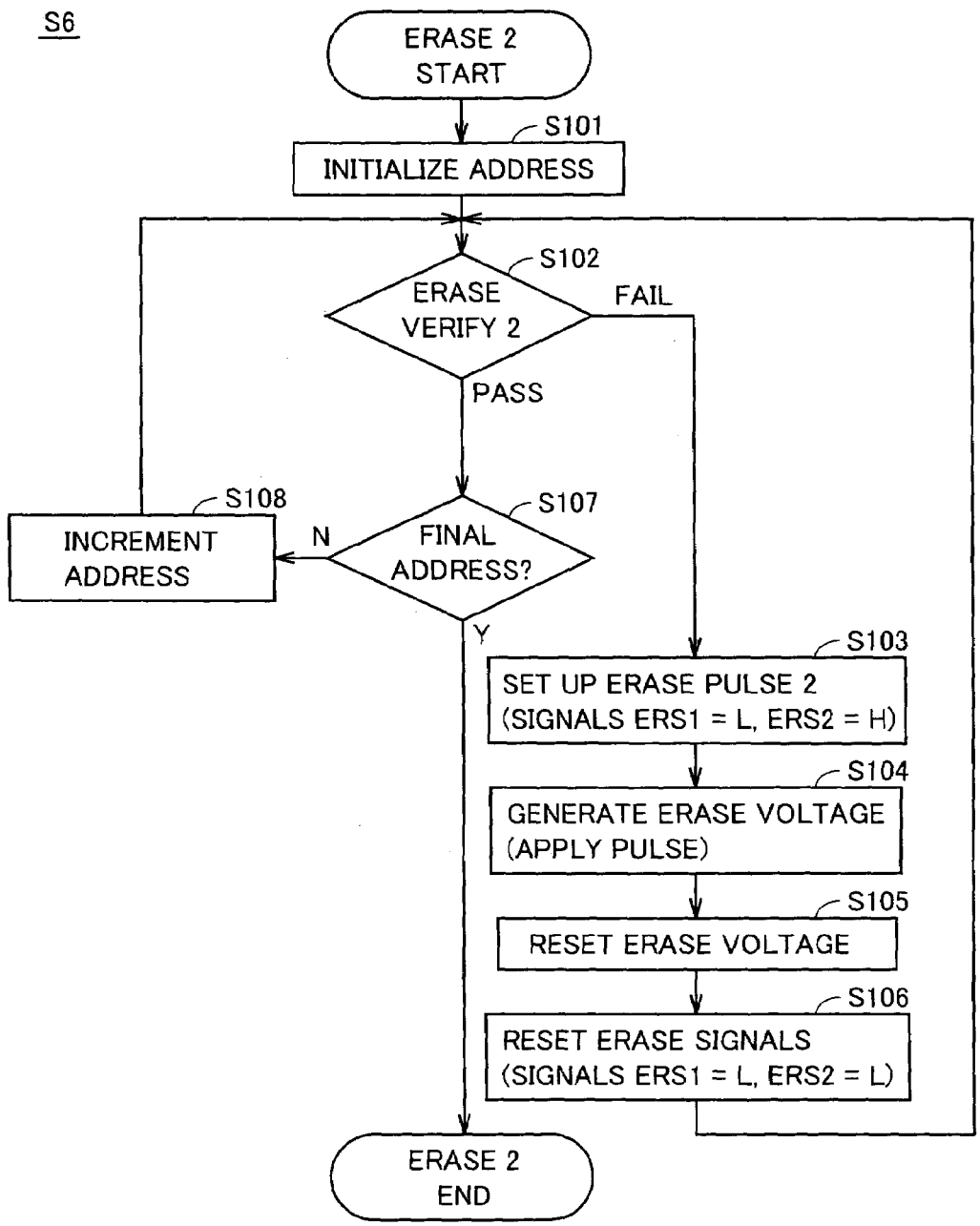
FIG. 5 is a flowchart for specifically illustrating an erasing operation in a step S6 shown in FIG. 4.

FIG. 5 is a flowchart for specifically illustrating an erasing operation in step S6 shown in FIG. 4.

Referring to FIG. 5, when the operation of the erase 2 in step S6 starts, processing in a step S101 is first performed to initialize the address designating the memory cell to be verified.

In a next step S102, the erase verify 2 is performed. By this erase verify 2, data is read from the memory transistor corresponding to the currently set address. When it is determined that the data held in the memory transistor is already erased, the memory transistor passes the erase verify.

For example, when data in memory block BL0CK0 shown in FIG. 3 is to be erased, the erase verify 2 in step S102 is performed by individually determining 16 memory transistors. After the initialization of the address, reading is first performed from memory transistor M00. If memory transistor M00 is not yet erased, it fails the erase verify.

When the erase verify 2 is failed in step S102, the operation moves to a step S103. In step S103, signals ERS1 and ERS2 are set up for applying the erase pulse 2.

Signal ERS1 supplied to X-decoder 18 shown in FIG. 2 attains the H-level when the erase pulse 1 is to be applied, and signal ERS2 attains the H-level when the erase pulse 2 is to be applied.

Write and erase control portion 2 shown in FIG. 1 sets signal ERS1 to the L-level, and sets signal ERS2 to the H-level. Thereby, X-decoder 18 shown in FIG. 2 selects a region including the memory transistor corresponding to the verify address, which is currently set.

As a specific example, such a case that memory transistor M11 is selected will now be described. According to the current setting of the address, address signals AX0 and AX1 are set to the H- and L-levels as shown in FIGS. 2 and 3, respectively.

Signals IAX0 and IAX1, which are inverted signals thereof, are at the L- and H-levels, respectively. Thereby, AND circuit 46 issues an output signal at the L-level, and AND circuit 48 issues an output signal at the H-level, as shown in FIG. 2.

Subsequently, an operation is performed in a step S104 to apply an erase voltage from voltage generating portion 3 to word line driver 32. Thereby, word lines WL0 and WL1 are driven to negative potential VN corresponding to the L-level. Potential VN is equal to, e.g., −10 V. Word lines WL2 and WL3 are driven to potential VP corresponding to the H-level. In the erasing operation, potential VP is equal to, e.g., 0 V.

In the above manner, the erase pulse 2 is applied to memory transistors M00–M03 and M10–M13. In this operation, the erase pulse 2 is not applied to memory transistors M20–M23 and M30 and M33.

Subsequently, the erase voltage provided from voltage generating portion 3 is reset in a step S105. In a next step S106, control signals in the erasing operation are reset. Thus, both signals ERS1 and ERS2 are set to the L-level.

After the signals are reset in step S106, the erase verify 2 is performed again in step S102. When the verify is passed in step S102, it is determined in a step S107 whether the currently set address is the final address of not.

If it is not the final address, the address is incremented in a step S108, and the erase verify is subsequently performed by reading the data from the next memory transistor in step S102. When it is determined in step S107 that the currently set address is the final address, the operation of the erase 2 in step S6 is completed.

In the operation of applying the erase pulse 2 as shown in FIG. 5, signals ERS1 and ERS2 are set to the L- and H-levels, respectively, in contrast to the operation of applying the erase pulse 1 in steps S2 and S3 shown in FIG. 4. Therefore, if address signal AX1 is, e.g., at the L-level when the erase pulse 2 is applied, negative potential VN is applied to word lines WL0 and WL1, and 0 V is placed on word lines WL2 and WL3. Conversely, if address signal AX1 is at the H-level, 0 V is placed on word lines WL0 and WL1, and negative potential VN is applied to word lines WL2 and WL3. In this manner, the erase pulse 2 is applied to only half the word lines in the block.

By applying the erase pulse 2 to half the region as described above, it is possible to prevent excessive application of the erase pulse, as compared with a conventional manner. In the conventional manner, after the erase verify 2, e.g., of memory transistor M00 is completed in FIG. 3, the erase verify 2 will be effected on the remaining 15 memory transistors so that the excessive erase pulse will be applied to memory transistor M00 until the memory transistor passes the erase verify 2.

According to the first embodiment of the invention, however, the erase pulse 2 is no longer applied excessively to memory transistor M00 after memory transistors M01–M03 and M10–M13 passed the verify. Therefore, it is possible to reduce the possibility of over-erasing of memory transistor M00.

Thus, it is possible to reduce the number of memory cells, which have threshold voltages shifted below the allowable lower limit when the operation of the erase 2 in step S6 is completed. This can reduce the number of the memory transistors, on which the over-erase recovery writing is to be effected bit by bit in step S9, so that the total erase time can be reduced.

[Second Embodiment]

In the first embodiment, the word lines are selected for limiting the region of second application of the erase pulse. Instead of selecting the word lines, the second embodiment uses the bit lines for limiting the region of application of the erase pulse.

A nonvolatile semiconductor memory device of the second embodiment includes an X-decoder 18A instead of X-decoder 18 in the structure shown in FIG. 1, and write and erase control portion 2 performs the control by applying signals ERS to X-decoder 18A in a manner different from that of the first embodiment.

Figure 6:
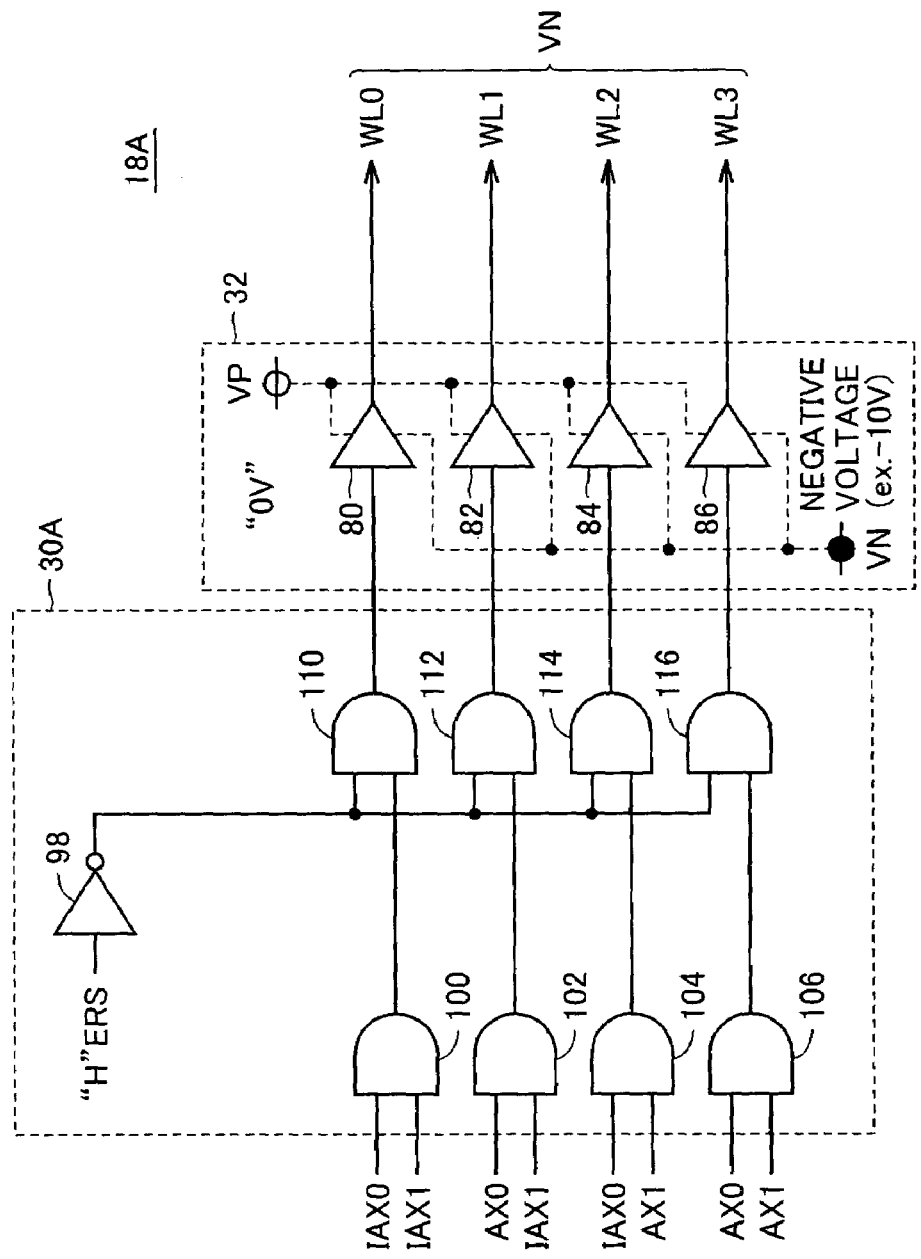
FIG. 6 is a circuit diagram showing a structure of an X-decoder 18A employed in a second embodiment.

FIG. 6 is a circuit diagram showing a structure of X-decoder 18A used in the second embodiment.

Referring to FIG. 6, X-decoder 18A includes a select portion 30A instead of select portion 30 in the structure of X-decoder 18 shown in FIG. 2.

Select portion 30A includes an inverter 98 receiving and inverting signal ERS, an AND circuit 100 receiving signals IAX0 and IAX1, an AND circuit 102 receiving signals AX0 and IAX1, an AND circuit 104 receiving signals IAX0 and AX1, and an AND circuit 106 receiving signals AX0 and AX1.

Select portion 30A further includes an AND circuit 110 receiving the outputs of inverter 98 and AND circuit 100, an AND circuit 112 receiving the outputs of inverter 98 and AND circuit 102, an AND circuit 114 receiving the outputs of inverter 98 and AND circuit 104, and an AND circuit 116 receiving the outputs of inverter 98 and AND circuit 106. AND circuits 110, 112, 114 and 116 provide their outputs to drive circuits 80, 82, 84 and 86, respectively.

Figure 7:
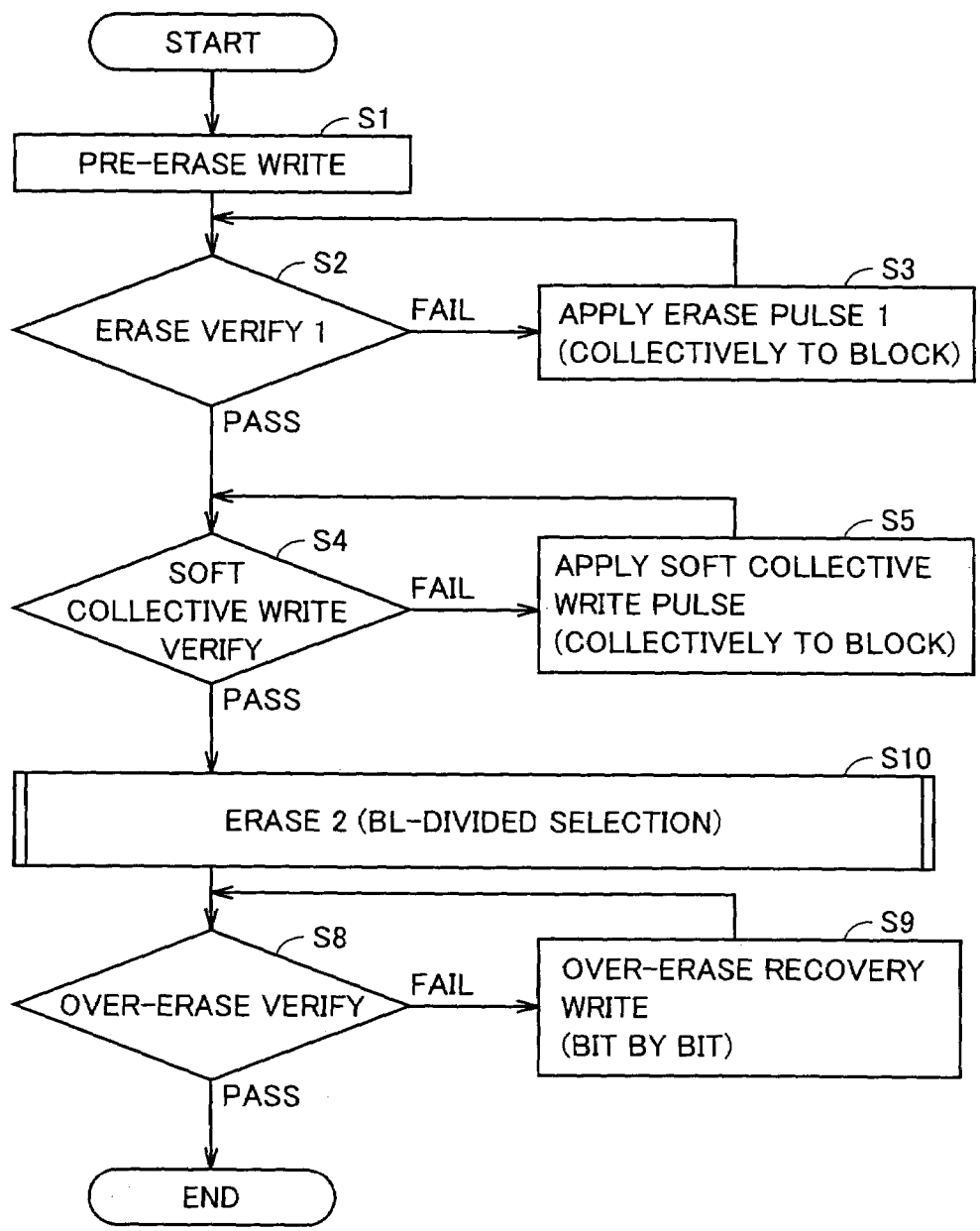
FIG. 7 is a flowchart for illustrating a block erasing operation of the second embodiment.

FIG. 7 is a flowchart for illustrating the block erasing operation of the second embodiment.

Referring to FIG. 7, the flowchart of the erasing operation of the second embodiment includes a step S10 instead of step S6 in the flowchart of FIG. 4. In step S10, the bit lines are divided for selection, and the operation of the erase 2 is performed.

Other steps are the same as those already described with reference to FIG. 4, and therefore description thereof is not repeated.

Figure 8:
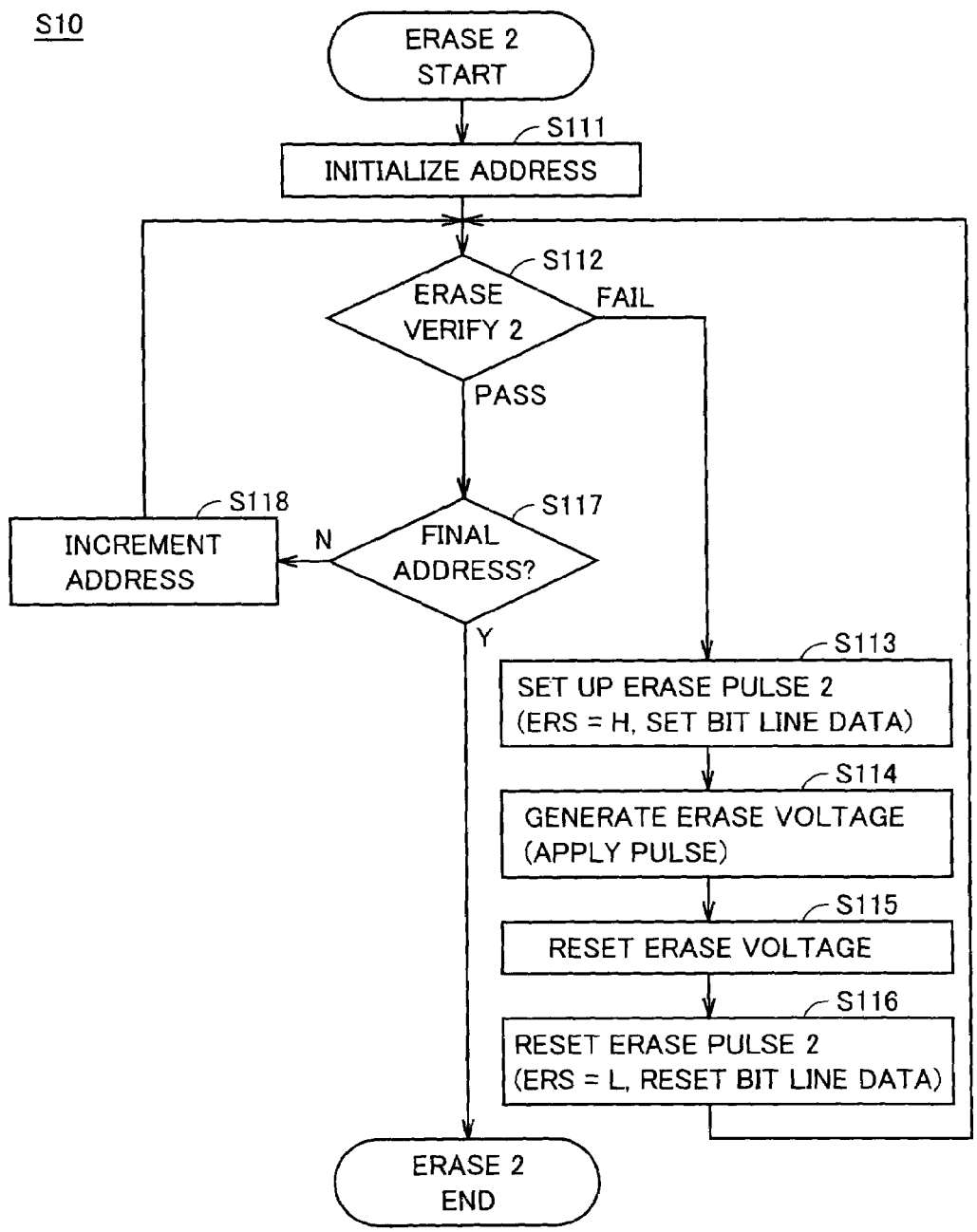
FIG. 8 is a flowchart for specifically illustrating a step S10 in FIG. 7.

FIG. 8 is a flowchart for specifically illustrating a step S110 in FIG. 7.

Referring to FIG. 8, when the operation of the erase 2 starts in step S10, the address of the memory cell to be verified is first initialized in a step S111. In a next step S112, the erase verify 2 is performed. In the erase verify 2, a read operation is effected on the memory transistor corresponding to the currently set address, and it is determined whether the data held in this memory transistor is already erased or not.

If the verify in step S112 is failed, the operation moves to a step S113, in which set-up for applying the erase pulse is performed. More specifically, write and erase control portion 2 sets signal ERS, which is sent to X-decoder 18A, to the H-level. When signal ERS attains the H-level, X-decoder 18A selects all word lines WL0–WL3 as shown in FIG. 6.

The bit lines are selected in accordance with data WDATA sent from write and erase control portion 2 to Y-related control circuit 24. In a step S113, data setting is performed such that the erase pulse is applied only to the bit line corresponding to the memory transistor, which is verified in step S112. When the set-up is completed, the operation moves to a step S114, in which the erase voltage is generated, and the erase pulse is applied to the selected region.

Figure 9:
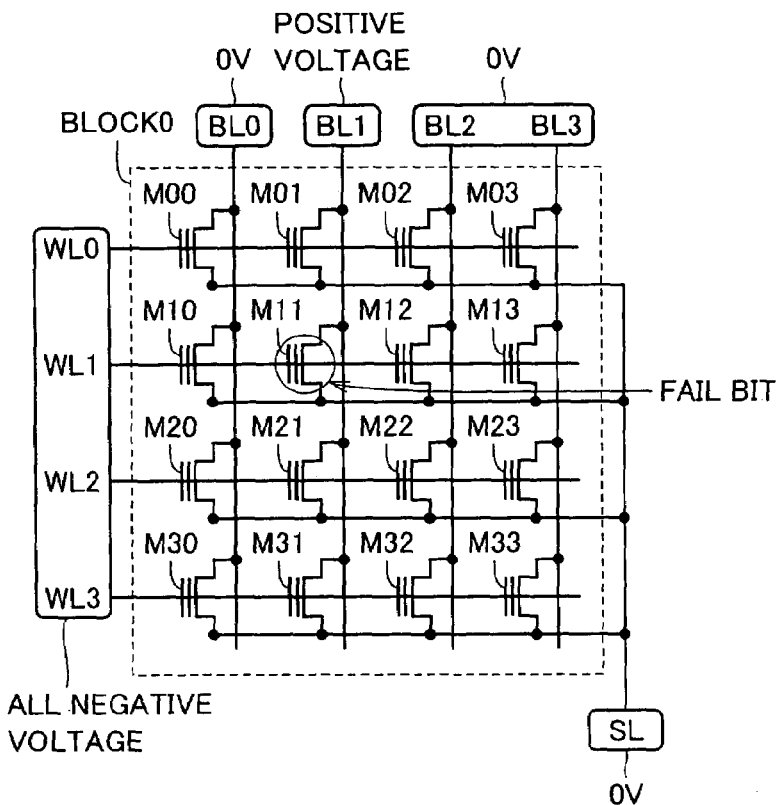
FIG. 9 shows a state of application of an erase pulse in a step S114 shown in FIG. 8.

FIG. 9 illustrates a state of application of the erase pulse in step S114 shown in FIG. 8.

Referring to FIGS. 8 and 9, if the memory transistor verified in step S112 is memory transistor M11, the word lines and bit lines in step S114 enter such a state that a negative voltage is placed on all word lines WL0–WL3, a positive voltage is placed on bit line BL1, and 0 V is placed on bit lines BL0, BL2 and BL3. Further, potentials of source line SL and the P-well provided with memory block BL0CK0 are set to 0 V.

Consequently, memory transistors M01, M11, M21 and M31 connected to bit line BL1 are selected as a region, on which the erase pulse 2 is to be applied, and the erase pulse 2 is not applied to the other memory transistors.

Figure 10:
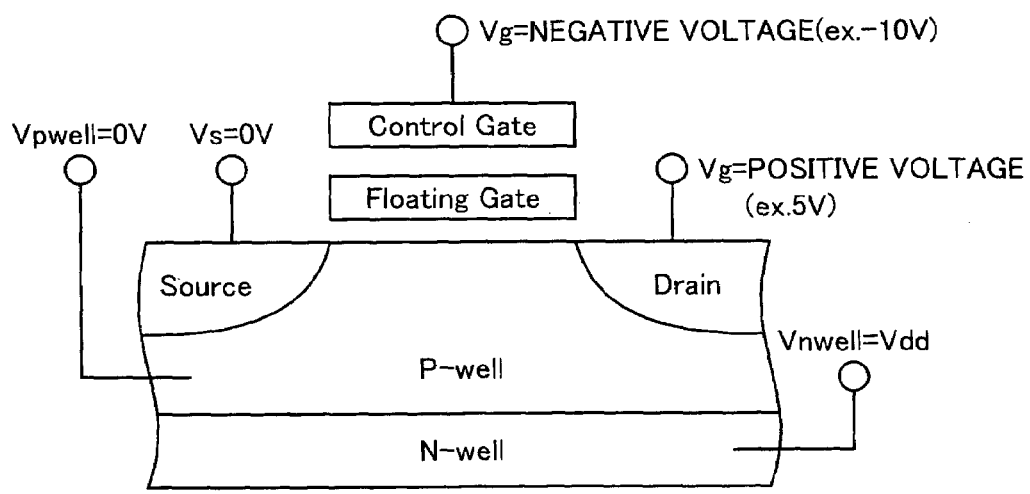
FIG. 10 shows a state of voltage application in a memory transistor selected in step S114 shown in FIG. 8.

FIG. 10 shows a state of voltage application in the memory transistor selected in step S114 shown in FIG. 8.

Referring to FIG. 10, the control gate connected to the word line is set to a negative voltage, e.g., of −10 V. The drain of the memory transistor connected to bit line BL1 is set to a positive voltage, e.g., of 5 V. The source of the memory transistor connected to source line SL is set to 0 V. The potential of the P-well internally provided with the memory transistor is set to 0 V. The potential of the N-well located under the P-well is set to power supply potential Vdd.

Referring to FIG. 8 again, when the pulse application is completed in step S114, the erase voltage is reset in a step S115. Then, an operation is performed in a step S116 to reset the set-up conditions previously set in step S113. More specifically, signal ERS is set to the L-level, and data setting for the bit line is reset. Then, it is determined again in step S112 whether the application of the erase pulse changed the bit, which failed verify, to pass the verify or not.

If the verify in step S112 is passed, the operation moves to a step S117. In step S117, it is determined whether the currently set address is the final address or not. If it is not the final address, the operation moves to a step S118, and the address is incremented. This address increment is performed by successively incrementing the row address and the column address so that the memory transistors included in memory block BL0CK0 may be verified one by one. When the address is incremented, the next operation is performed in step S112 to verify the memory transistor following the memory transistor, which passed the verify.

If the address of the memory transistor, which passed the verify, is the final address in step S117, the operation of the erase 2 in step S10 ends.

According to the second embodiment, as described above, the erase pulse 2 is applied only to the memory cells on the selected bit line to shift threshold voltage Vth. Thereby, in the state where all the memory transistors passed the erase verify 2, it is possible to reduce the number of the memory cells having the threshold voltages, which exhibit the distribution protruding below the lower limit, as compared with the conventional manner. Therefore, the number of memory transistors to be subjected to the over-erase recovery writing decreases, and the erasing can be performed fast.

Since a positive voltage, which is compatible with the ordinary read and write operations, is applied to the bit lines, each bit line can be easily selected independently of the others. Since each block includes 256 or more bit lines, remarkable improvement can be achieved.

[Third Embodiment]

For applying the erase pulse, the number of word lines to be selected is restricted in the first embodiment, and the number of bit lines to be selected is restricted in the second embodiment. In a third embodiment, these manners are combined, and both the number of the bit lines to be selected and the number of the bit lines to be selected are restricted for applying the erase pulse.

Figure 11:
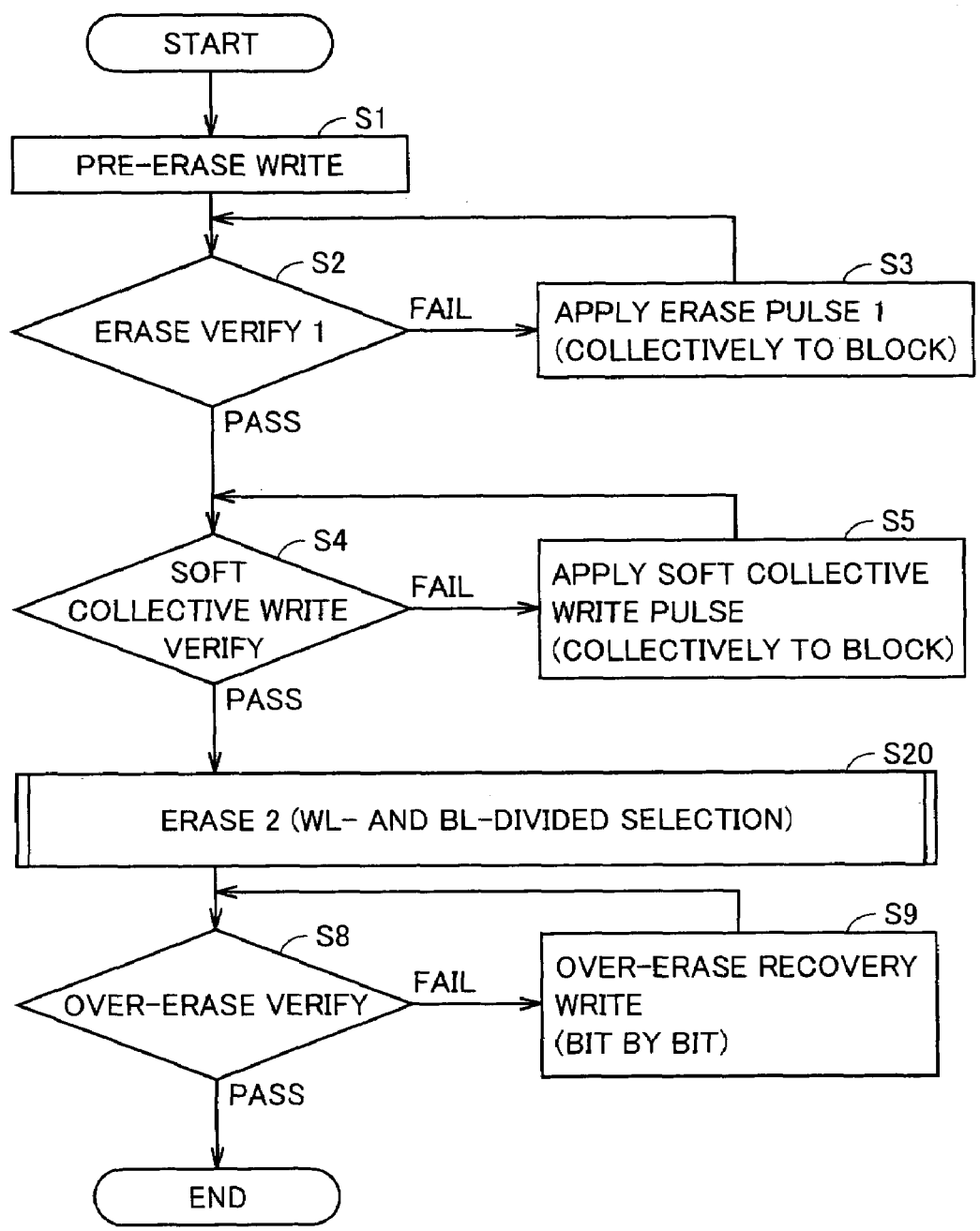
FIG. 11 is a flowchart for illustrating a block erasing operation of a third embodiment.

Referring to FIG. 11, the operation of block erasing in the third embodiment includes a step S20 instead of step S6 in the flow of block erasing of the first embodiment illustrated in FIG. 4. In step S20, the word lines and the bit lines are divided into multiple groups for selection.

More specifically, X-decoder 18 shown in FIG. 2 is used, and the setting data of the bit lines to be applied from write and erase control portion 2 to Y-related control circuit 24 is limited corresponding to the address, which is being verified.

Figure 12:
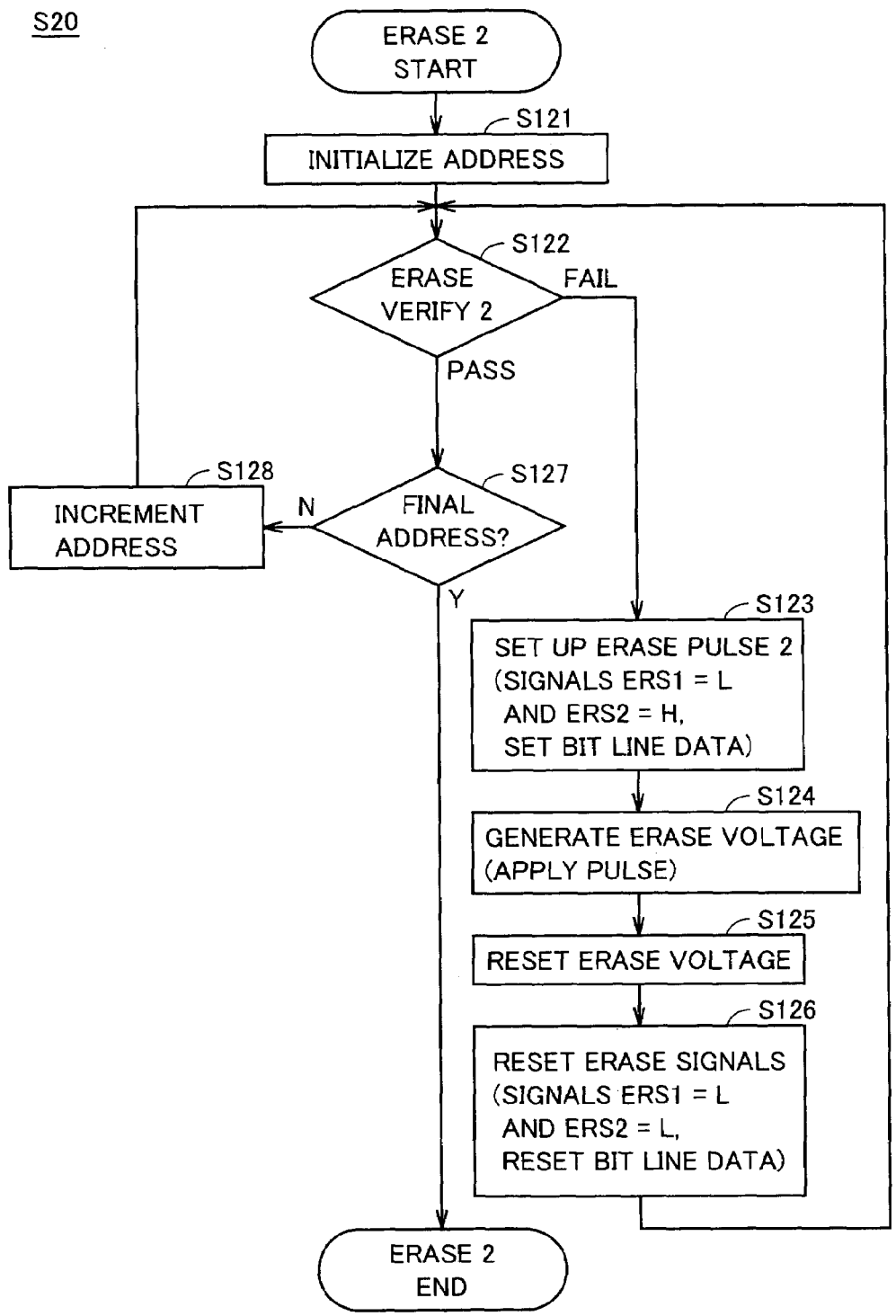
FIG. 12 is a flowchart for illustrating a specific operation in a step S20 shown in FIG. 11.

FIG. 12 is a flowchart for illustrating a specific operation in step S20 shown in FIG. 11.

Referring to FIG. 12, when the operation of the erase 2 in step S20 starts, an operation is first performed in a step S121 to initialize the address designating the memory cell to be verified.

Then, the erase verify 2 is performed in a step S122. In this erase verify 2, data is read from the memory transistor corresponding to the currently set address. When it is determined that the data held in the memory transistor is already erased, the memory transistor passes the erase verify.

In the case of erasing, e.g., memory block BL0CK0, the erase verify in step S122 is effected individually on the 16 memory transistors. Immediately after the initialization of the address, reading is first performed from memory transistor M00. If memory transistor M00 is not yet erased, it fails the erase verify.

When the erase verify is failed in step S122, a next operation is performed in a step S123. In step S123, set-up is performed for applying the erase pulse.

In the set-up processing, signal ERS1 sent from write and erase control portion 2 to X-decoder 18 is set to the H-level, and signal ERS2 is set to the L-level. Thereby, half word lines among word lines WL0–WL3 are selected corresponding to the verify address. Further, selection of the bit lines is performed in accordance with data WDATA sent from write and erase control portion 2 to Y-related control circuit 24. In step S123, data setting is performed such that the erase pulse is applied only to the bit line corresponding to the memory transistors verified in step S122.

When the set-up ends, the operation moves to a step S124, in which the erase voltage is generated, and the erase pulse is applied to the selected region.

Figure 13:
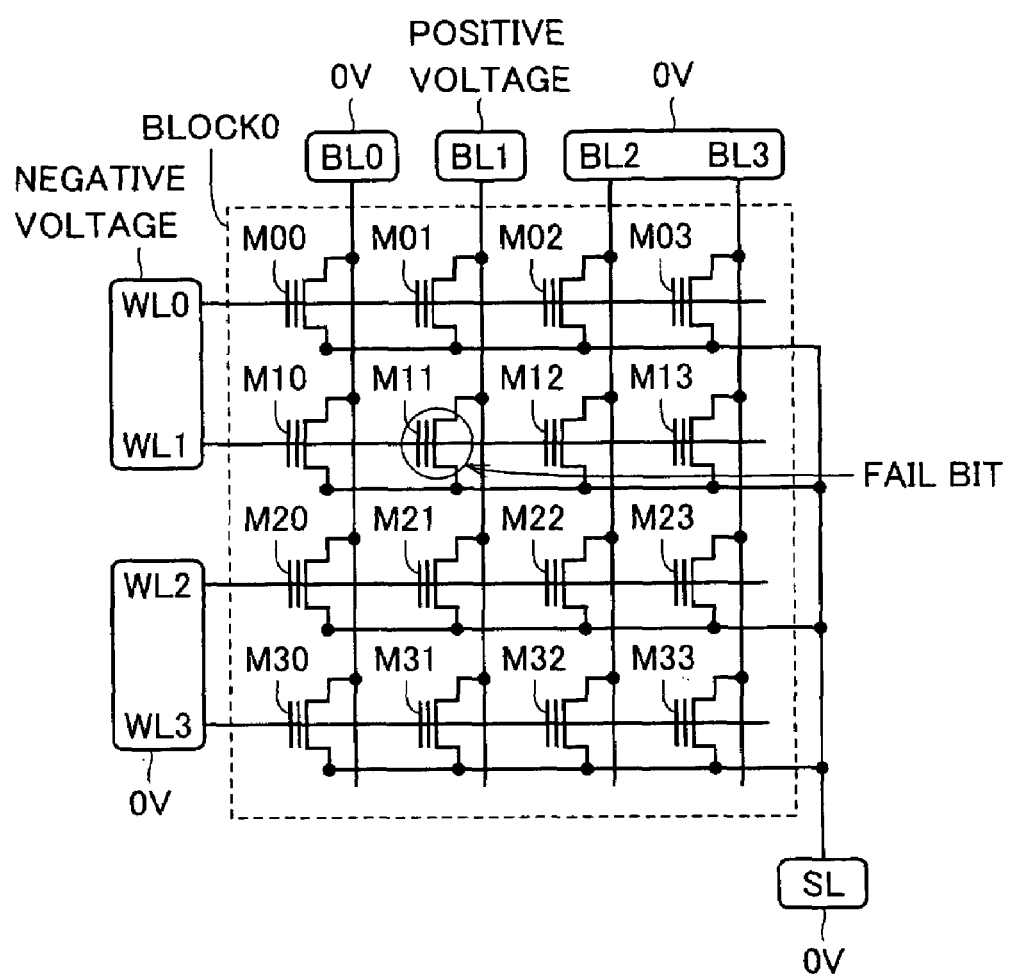
FIG. 13 shows a state of application of an erase pulse in a step S124 shown in FIG. 12.

FIG. 13 illustrates a state of application of the erase pulse in step S124 shown in FIG. 12.

Referring to FIG. 13, when the verify of memory transistor M11 is failed in step S122, word lines WL0 and WL1 are set to a negative voltage, and word lines WL2 and WL3 are set to 0 V as shown in FIG. 13. Bit line BL1 is set to a positive voltage, and bit lines BL0, BL2 and BL3 are set to 0 V. Source line SL and the P-well are set to 0 V. Consequently, the erase pulse 2 is applied to memory transistors M01 and M11. The erase pulse 2 is not applied to the other transistors. Memory transistors M01 and M11 carry voltages as already stated with reference to FIG. 10.

Half the word lines including the word line connected to the memory cell, which failed the erase verify 2, are selected, and the negative voltage is applied thereto. The positive voltage is applied to the bit line connected to the memory cell, which failed the erase verify 2, and the other bit lines are fixed to 0 V. In a memory array including more memory cells, the word lines may be divided into groups each including ¼ or ⅛ of the word lines for selection.

When the pulse application in step S124 ends, the erase voltage generated from voltage generating portion 3 is reset in step S125. In a next step S126, the control signal for erasing is reset. More specifically, both signals ERS1 and ERS2 are set to the L-level, and the data setting for the bit lines is reset. By applying the erase pulse, it is determined again in step S122 whether the bit, which previously failed the verify, passes the verify or not.

When the bit passes the verify in step S122, it is determined in step S127 whether the currently set address is the final address or not.

If it is not the final address, the address is incremented in a step S128, and the operation moves to step S122, in which the erase verify is performed by reading data from the next memory transistor. When it is determined in step S127 that the currently set address is the final address, the operation of the erase 2 in step S20 ends.

In the third embodiment, the erase 2 shifts the threshold voltage of the memory cell on the selected word line and the selected bit line. Therefore, the number of memory cells, of which threshold voltages are lower than the lower limit of the allowable range of the threshold voltage, can be reduced to a larger extent than the first and second embodiments. Therefore, the number of the memory cells, on which the over-erase recovery writing is to be effected, decreases so that the block erasing time can be short.

[Fourth Embodiment]

In a fourth embodiment, the control flow of the first embodiment illustrated in FIG. 4 is changed to reduce further the block erasing time.

Figure 14:
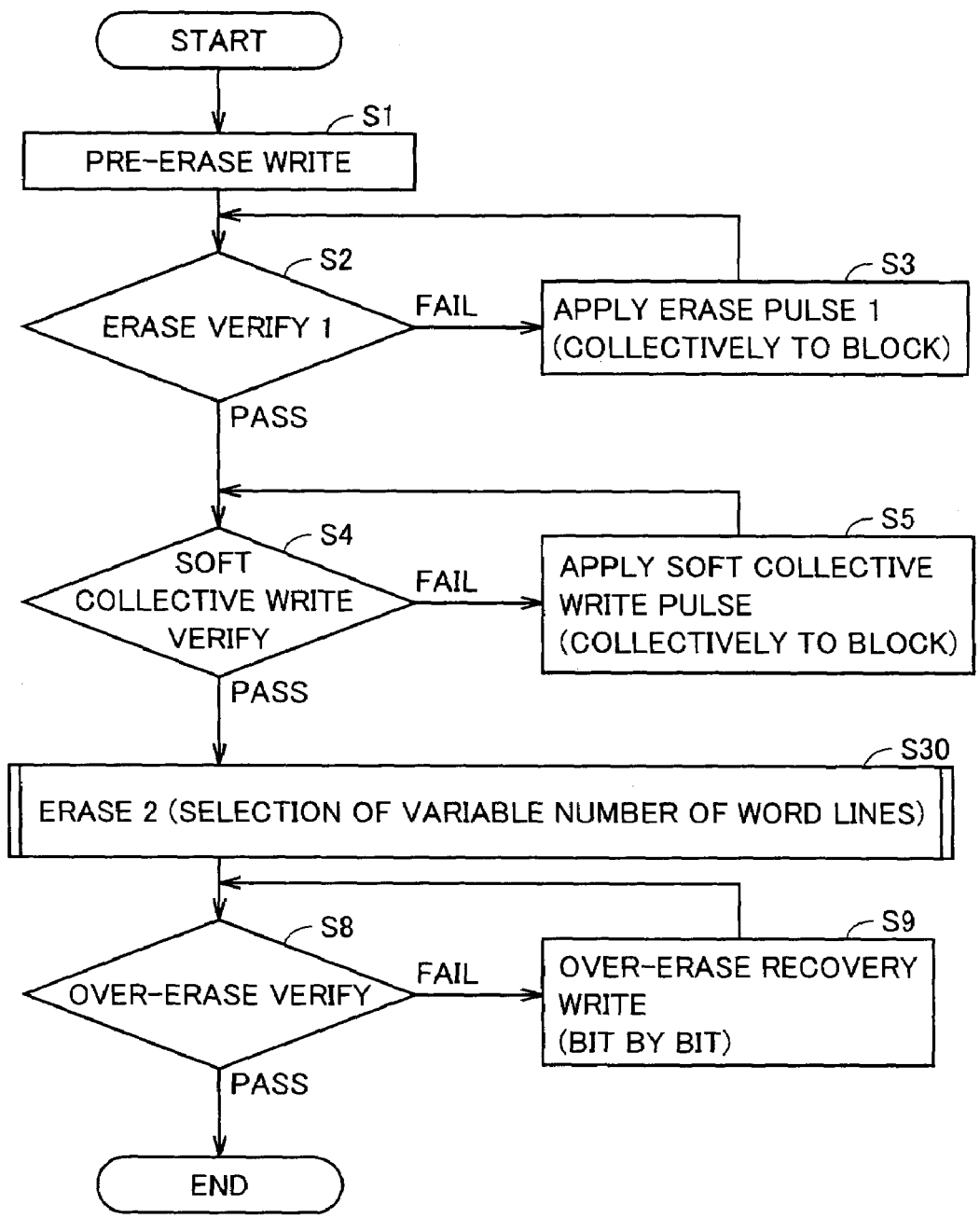
FIG. 14 is a flowchart for illustrating a block erasing operation in a fourth embodiment.

FIG. 14 is a flowchart for illustrating the block erasing operation of the fourth embodiment.

Referring to FIG. 14, the flowchart of the block erasing in the fourth embodiment includes a step S30 instead of step S6 in the flowchart of the block erasing in the fourth embodiment illustrated in FIG. 4. Other steps are the same as those in FIG. 4, and therefore description thereof is not repeated. In step S30, an operation is performed to change the number of word lines, which are to be selected in the operation of applying the erase pulse 2, in accordance with the number of pulses to be applied.

Figure 15:
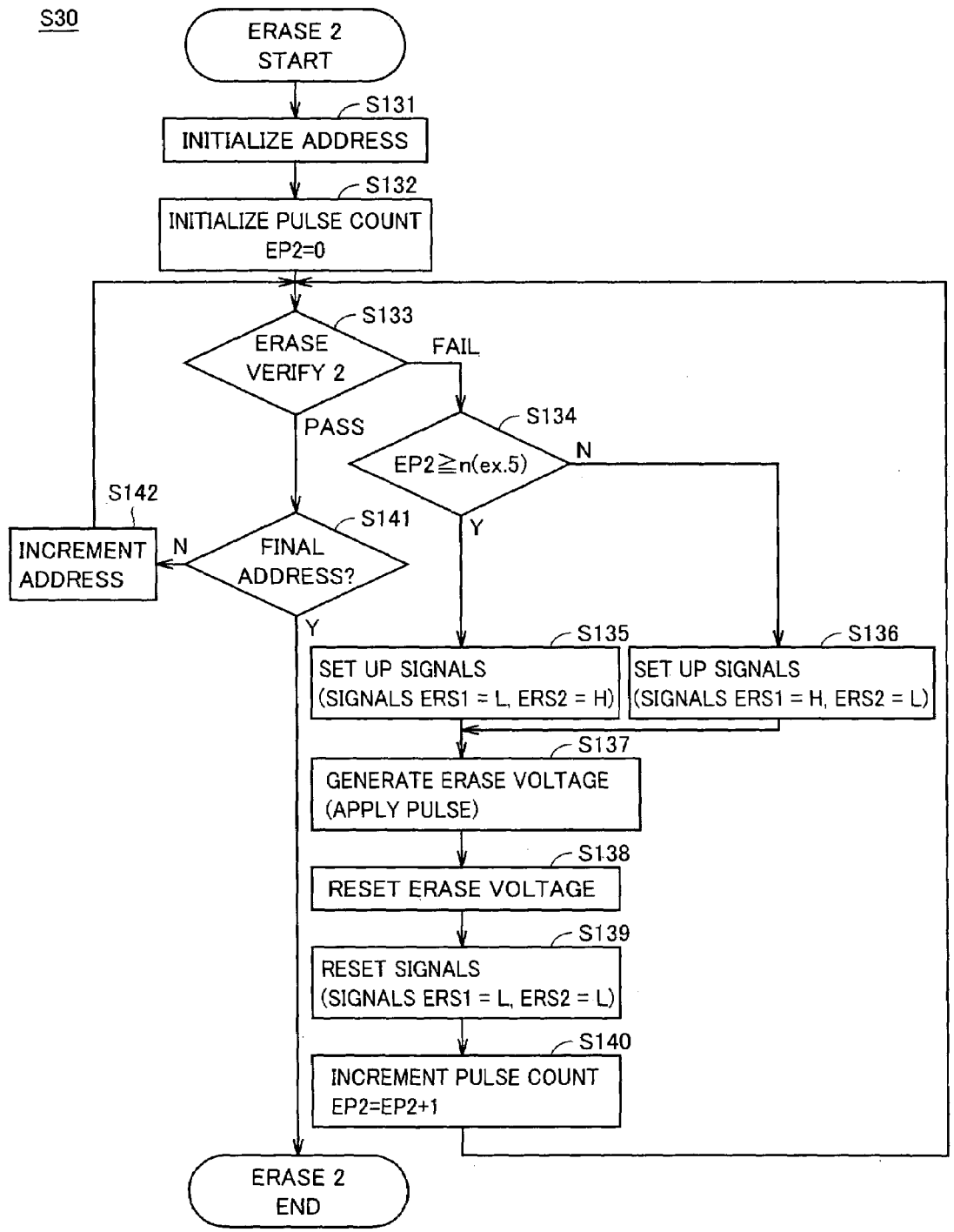
FIG. 15 is a flowchart for illustrating a specific operation in a step S30 shown in FIG. 14.

FIG. 15 is a flowchart for illustrating a specific operation in step S30 shown in FIG. 14.

Referring to FIG. 15, when the erasing operation starts in step S30, the address is first initialized in a step S131. Subsequently, a count of the erase pulses is initialized in a step S132. Four example, write and erase control portion 2 manages the pulse count as a count EP2. In this case, count EP2 is set to 0.

In a subsequent step S133, data is read from the memory cell corresponding to the currently set address, and the erase verify 2 is performed for determining whether this memory cell is already erased or not.

If the verify is failed in step S133, the operation moves to a step S134. In step S134, it is determined whether count EP2 of the erase pulses, which were applied for erasing in step S30, is equal to or larger than a predetermined value or not. For example, this predetermined value may be five.

When count EP2 is smaller than five, set-up is performed in a subsequent step S136. Signal ERS1 is set to the H-level, and signal ERS2 is set to the L-level. According to this setting, the application of the erase pulse in a subsequent step S137 is executed by applying the erase pulse collectively to the memory block.

If it is determined in step S134 that pulse count EP2 is equal to or larger than the predetermined value, the operation moves to a step S135. In step S135, set-up of the signals is performed so that signal ERS1 is set to the L-level, and signal ERS2 is set to the H-level. In this case, as already described in connection with the first embodiment, the erase pulse is applied only to the transistors, which are located in a specific region depending on the row address of the memory transistor verified in step S133.

In a step S137, the erase pulse is applied to the region set in step S135 or S136. In a step S138, the erase voltage is reset, and the signals are reset in a step S139. Thus, both signals ERS1 and ERS2 are set to the L-level.

In a subsequent step S140, pulse count EP2 is incremented. Thus, one is added to count EP2. After the pulse count is incremented in step S140, the operation is performed in step S133 to execute the erase verify 2 by reading data from the memory transistor corresponding to the currently set address.

When the memory transistor passes the erase verify 2 in step S133, it is then determined in a step S141 whether the address of the memory transistor, which passed the verify, is the final address or not. If it is not the final address, the operation moves to a step S142, in which the address is incremented, and the erase verify is performed again in step S133.

When it is determined in step S141 that the address of the memory transistor, which passed the verify, is the final address, the erasing operation in step S30 ends.

According to the fourth embodiment, as described above, while the number of erase pulses is small, all the word lines are selected, and the erase pulse is applied collectively to the memory transistors in the block.

When and after the number of erase pulses increases to the predetermined value n (e.g., five) or more, the word lines are then divided into multiple groups for applying the erase pulse. Therefore, the erase pulse is simultaneously applied to the multiple bits for suppressing the number of times of the erase pulse application, and the erase pulse is further applied only to the word line including the bit, which could not be erased by the previously applied pulse. Thus, it is possible to optimize the region for applying the erase pulse.

Therefore, the number of times of the erase pulse application can be suppressed, and at the same time, it is possible to reduce the number of the memory cells, which require the over-erase recovery due to the threshold voltages falling below the lower limit.

[Fifth Embodiment]

A fifth embodiment provides a nonvolatile memory configured such that the bit lines are divided for applying the erase pulse similarly to the second embodiment, and further the pulse is no longer applied to the bit line of the bit, which passed the verify after application of an additional erase pulse.

Figure 16:
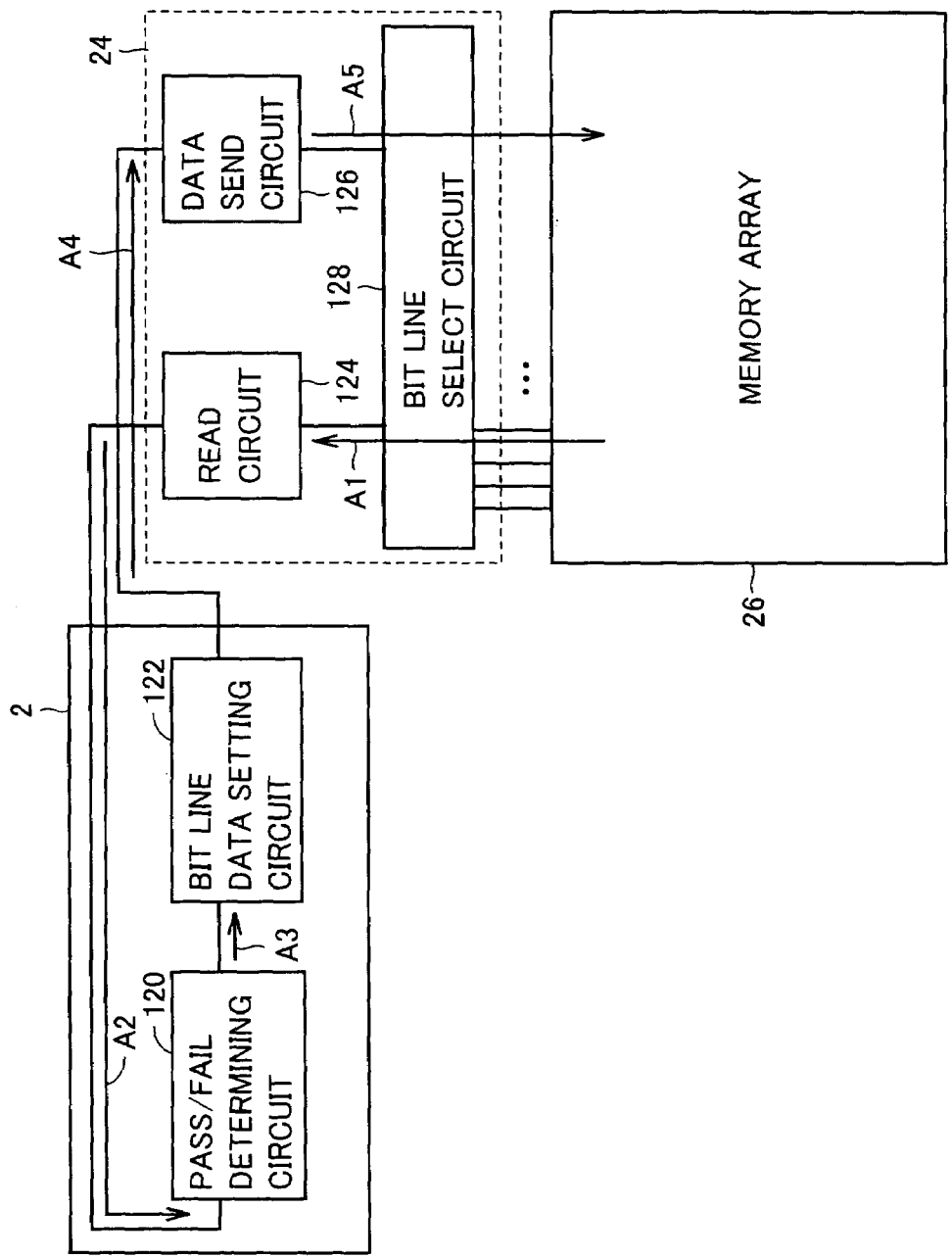
FIG. 16 is a block diagram showing a structure of a nonvolatile semiconductor memory device of a fifth embodiment.

FIG. 16 is a block diagram showing a structure of a nonvolatile semiconductor memory device of a fifth embodiment.

Referring to FIG. 16, arrows A1–A5 represent flows of signals. A pass/fail determining circuit 120 and a bit line data setting circuit 122 correspond to write and erase control portion 2 in FIG. 1. A read circuit 124, a data send circuit 126 and a bit line select circuit 128 correspond to Y-related control circuit 24 in FIG. 1.

First, read circuit 124 connected to the bit line via bit line select circuit 128 performs the reading for the second erase verify (arrow A1). For example, a chip externally sends and receives data of 8 or 16 bits via 8 or 16 I/O lines in accordance with one address. Read circuits 124 are arranged for the I/O lines of the chip, respectively, and can simultaneously perform the reading of the respective I/O lines at the same address.

Results of the reading are sent to pass/fail determining circuit 120 (arrow A2), and it is determined whether all the data sent from the respective I/O lines at the read address passed or not. When at least one bit in the read data failed, data corresponding to the erase pulse is set in bit line data setting circuit 122 only for the I/O line, which failed the verify, as indicated by an arrow A3. This data is set in data send circuit 126 (arrow A4), and the positive voltage sent from data send circuit 126 in the second erase pulse application is transmitted to the bit line via bit line select circuit 128 (arrow A5).

In this manner, the erase pulse is applied only to the bit line including the bit, which failed the erase verify. By employing this manner, it is possible to reduce the bits, on which the writing is to be effected for the over-erase recovery, and to reduce the block erasing time.

[Sixth Embodiment]

A sixth embodiment is configured to limit the number of the word lines selected for the write pulse application in the soft collective write operation, and thereby to limit the region for such pulse application. Similarly to the first embodiment, X-decoder 18 is used, but a control flow is different from that in the first embodiment.

Figure 17:
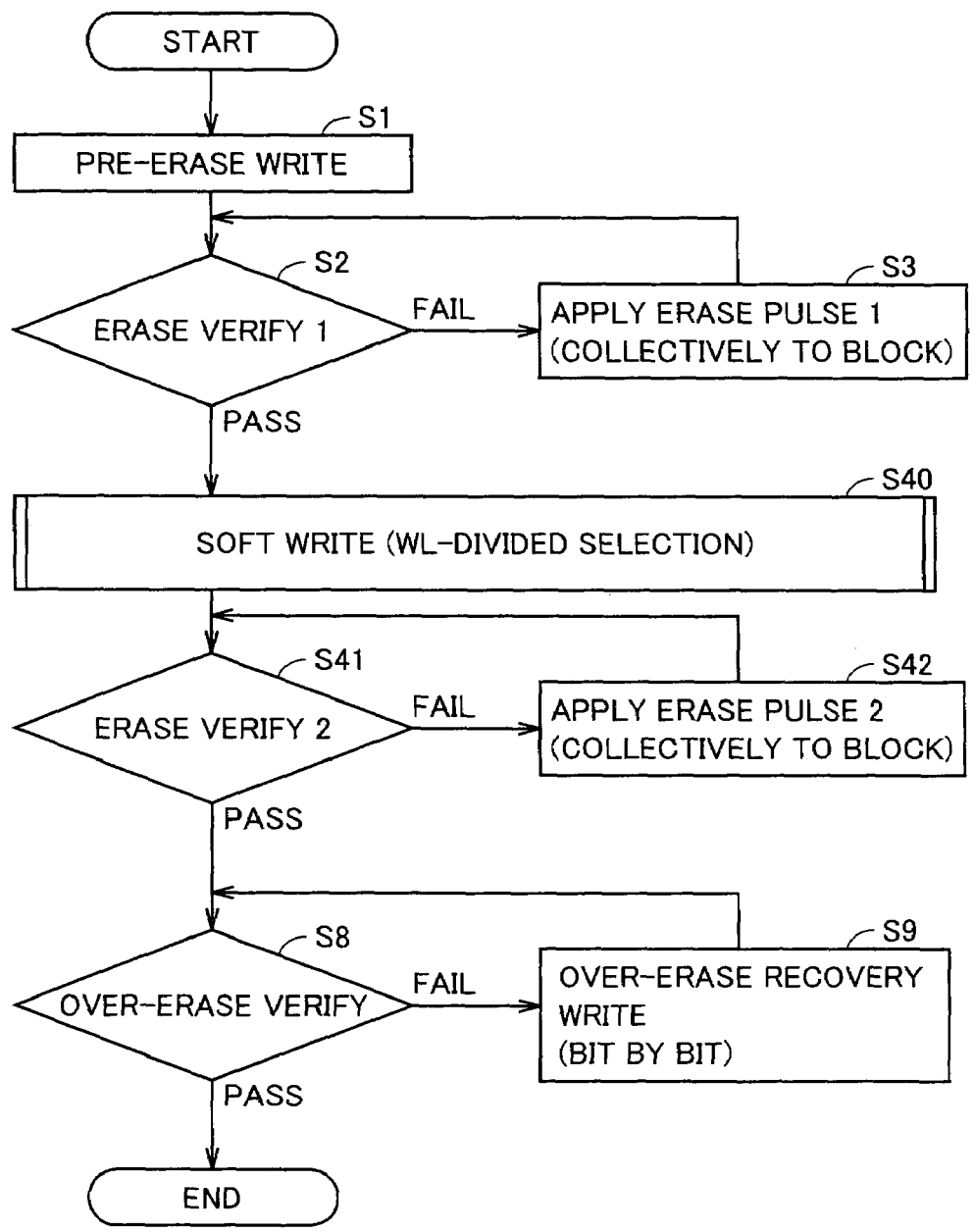
FIG. 17 is a flowchart for illustrating a block erasing operation of a sixth embodiment.

FIG. 17 is a flowchart for illustrating a block erasing operation of the sixth embodiment.

Referring to FIG. 17, the block erasing operation in the sixth embodiment is performed in the same manner as a conventional operation in connection with the application of the erase pulse 1 and the erase verify 1, but is different therefrom in the soft collective write operation, and particularly in that the number of the word lines to be selected is reduced to half the number of the word lines, which are selected in the conventional block collective selection. Instead of dividing the word lines into halves, the word lines may be divided into groups each including ¼ or ⅛ of the word lines.

The operation flow will now be successively described.

When the block erase command is applied, the pre-erase writing is performed in step S1, and the erase verify 1 is performed in step S2. In step S3, the erase pulse 1 is applied. Steps S1–S3 are the same as those in the first embodiment already described with reference to FIG. 4, and therefore description thereof is not repeated.

Figure 26:
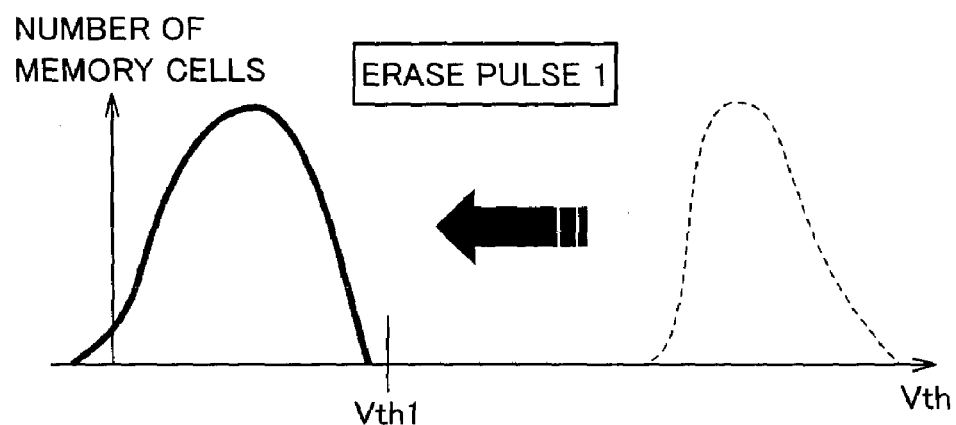
FIG. 26 shows a distribution of threshold voltages exhibited after application of the erase pulse 1.
Figure 27:
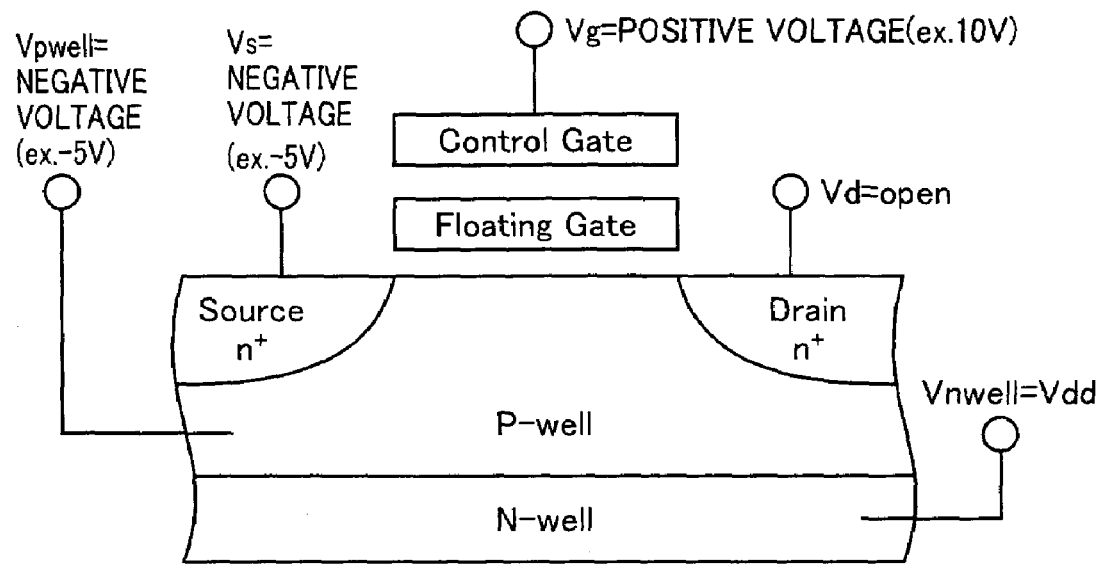
FIG. 27 shows a state of voltages applied in the memory cell when a soft collective write pulse is applied.

When the erasing operation is completed in steps S2 and S3, the distribution of threshold voltages of the memory cells in the memory block has already moved to a region smaller than verify voltage Vth1 as shown in FIG. 26. Assuming that the first erased state is the state attained immediately after passing of the erase verify 1 in step S2, the first erased state is an erased state at a midpoint in the course of the collective erasing of the memory block. More specifically, the lower end of the threshold voltage distribution may protrude into a region, where the over-erasing occurs, and thus the threshold voltage does not exceed 0 V. Therefore, the processing of soft writing is effected in a step S40

Figure 18:
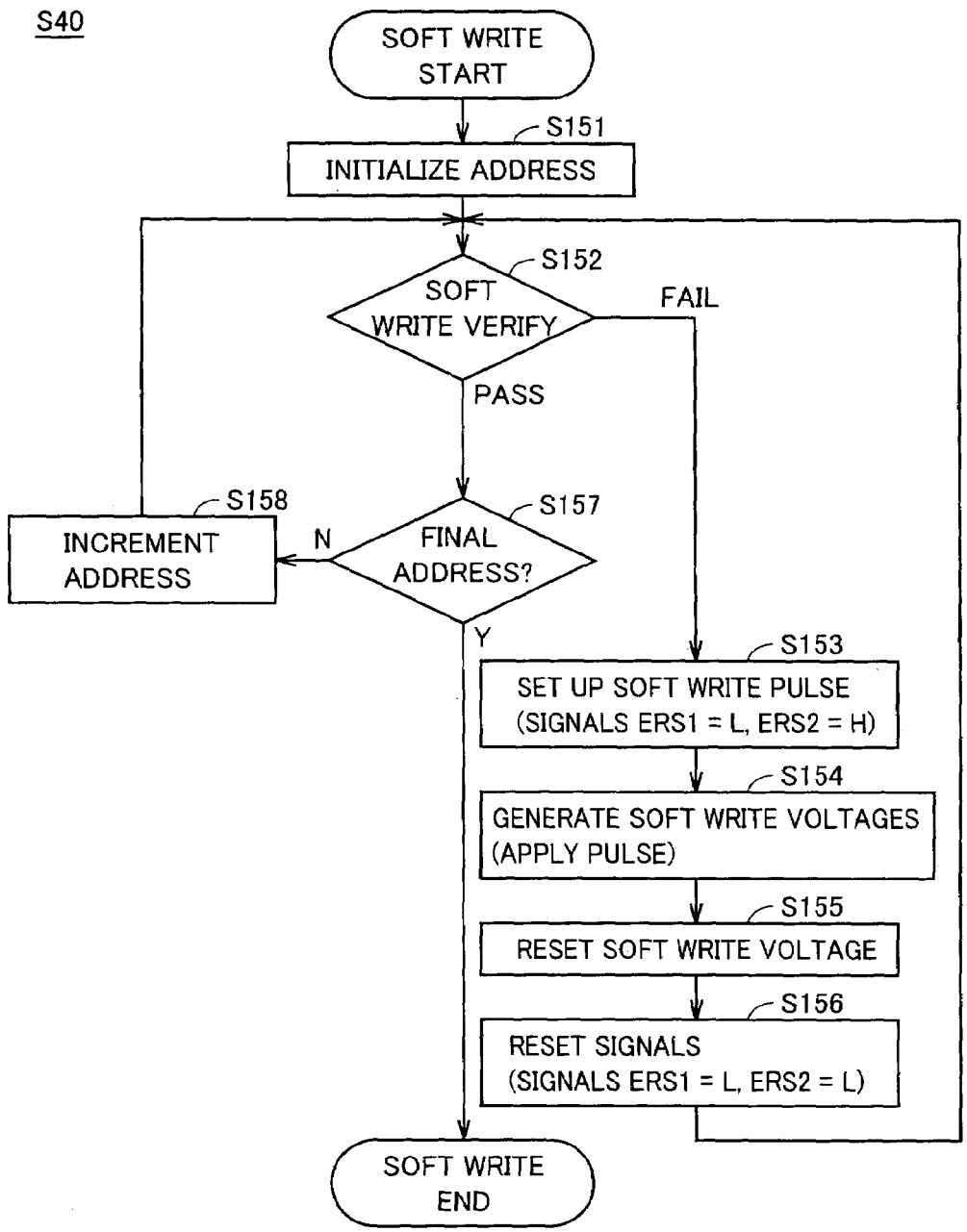
FIG. 18 is a flowchart for specifically illustrating soft write operation in a step S40 shown in FIG. 17.

FIG. 18 is a flowchart for specifically illustrating the soft write operation in step S40 shown in FIG. 17.

Referring to FIG. 18, when the soft write operation in step S40 starts, an operation is first performed in a step S151 to initialize the address designating the memory cell to be verified.

In a subsequent step S152, the soft write verify is performed. In this soft write verify, data is read from the memory transistor corresponding to the address, which is currently set. When it is determined that soft writing of the data held in the memory transistor is performed, the memory transistor passes the soft write verify. Assuming that the state of the memory block, in which the soft write verify has passed, is a "first written state", the threshold voltage of the memory cell is higher than the predetermined threshold voltage in the first written state. However, this predetermined threshold voltage is lower than an upper limit of the threshold voltage distribution in the first erased state, which is attained immediately after the memory transistor passed the erase verify 1 in step S2.

When erasing is to be effected, e.g., on memory block BL0CK0, the soft write verify in step S152 is effected individually on the 16 memory transistors. Immediately after the initialization of the address, data is read from memory transistor M00, and memory transistor M00 fails the soft write verify if the soft writing is not yet effected on it.

If the soft write verify is failed in step S152, the operation moves to a step S153. In step S153, signals ERS1 and ERS2 are set up for applying the soft write pulse.

Write and erase control portion 2 in FIG. 1 sets signal ERS1 to the L-level, and sets signal ERS2 to the H-level. Thereby, X-decoder 18 shown in FIG. 2 selects a region including the memory transistor, which corresponds to the currently set verify address.

In a subsequent step S154, voltage generating portion 3 provides a soft write voltage to word line driver 32.

Figure 19:
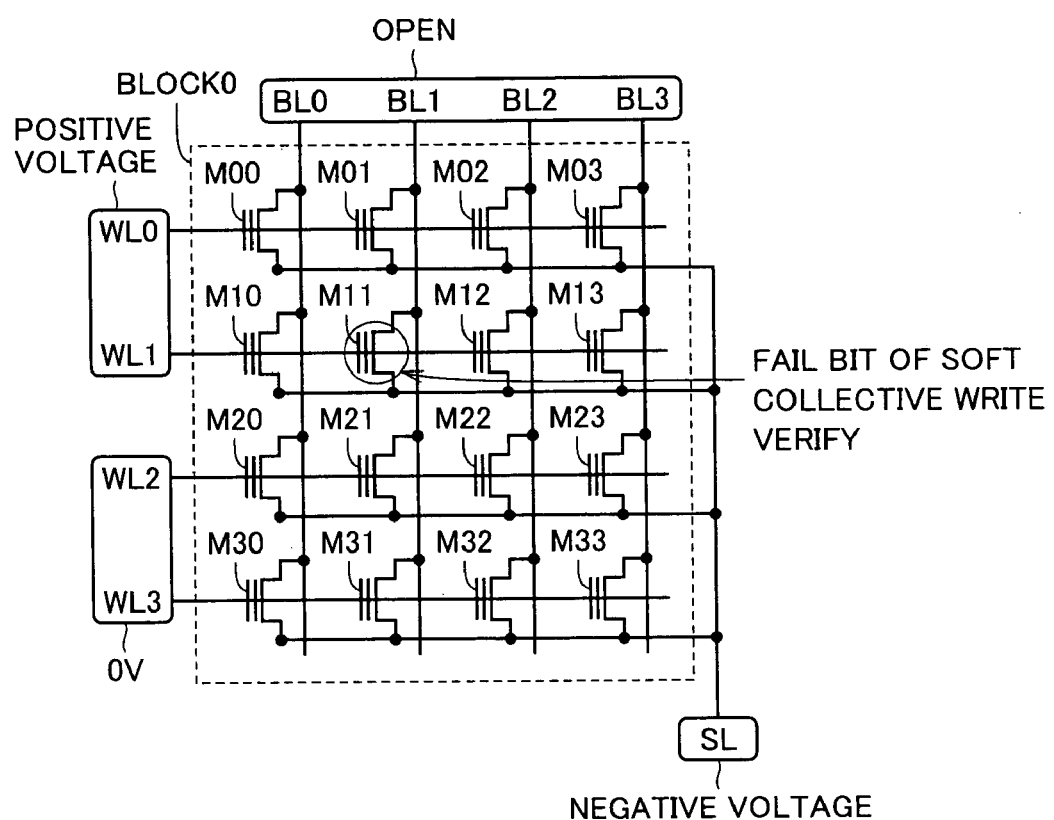
FIG. 19 shows a state of voltage application in a memory block exhibited when a soft write pulse is applied in a step S154.

FIG. 19 shows a state of voltage application in the memory block, which is exhibited when the soft write pulse is applied in step S154.

Referring to FIG. 19, word lines WL0 and WL1 are driven to the positive voltage corresponding to the H-level. This positive voltage is, e.g., +10 V. Word lines WL2 and WL3 are driven to 0 V corresponding to the L-level. In the erased state, potential VP is, e.g., 0 V. Bit lines BL0–BL3 are set to the open state. Source line SL and the P-well are set to the negative voltage, e.g., of −5 V.

In the above manner, the soft write pulse is applied to memory transistors M00–M03 and M10–M13. In this operation, the soft write pulse is not applied to memory transistors M20–M23 and M30–M33.

In the soft write operation, the word lines, which are half the word lines in the memory block, are selected. However, the X-decoder may be modified to select ¼ or ⅛ of the word lines provided that the selected region include the memory cells to be verified.

Referring to FIG. 18 again, when step S154 is completed, the soft write voltage provided from voltage generating portion 3 is reset in a step S155. In a next step S156, the control signals are reset. Thus, both signals ERS1 and ERS2 are set to the L-level.

When the resetting of the signals in step S156 is completed, the soft write verify is performed again in step S152. When the verify is passed in step S152, it is determined in step S157 whether the currently set address is the final address or not.

If it is not the final address, the address is incremented in step S158, and the operation moves to step S152, in which the soft write verify is performed by reading data from the next memory transistor. If it is determined in step S157 that the currently set address is the final address, the soft writing in step S40 is completed.

Referring to FIG. 17 again, after the soft writing in step S40 ends, an operation is performed in steps S41 and S42 to set the memory block to the second erased state. This second erased state is a state attained after the first erased state, which is attained immediately after passing of step S2 in the course of block collective erasing. In the setting operation, reading from the respective memory transistors is performed while changing the row and column addresses, and it is determined by the erase verify 2 in step S41 whether the memory cell is in the erased state or not.

Every time it is determined in step S41 that the memory cell is not yet erased, the erase pulse 2 is applied collectively to the memory block in step S42.

The application of the erase pulse 2 in step S42 is performed by setting the word lines, bit lines and source line to predetermined voltages. More specifically, all word lines WL0–WL3 are set to a negative voltage, all bit lines are set to an open state, and source line SL is set to a positive voltage.

In step S42, X-decoder 18 shown in FIG. 2 sets signals ERS1 and ERS2 to the H- and L-levels, respectively. Thereby, the input levels of all the word line drivers attain the L-level independently of the address of the erase verify 2 performed in step S41. By selecting the word lines in this manner, all word lines WL0–WL3 in the block carry the negative potential, and the erase pulse is applied collectively to the memory transistors included in the memory block.

The above setting of the voltages results in such an operation that the erase pulse, which can act to lower the threshold voltage, is applied collectively to all the memory cells in the memory block. By applying the erase pulse, the tunneling phenomenon pulls out the electrons from the floating gate, and thus lowers threshold voltage Vth.

When the erase verify 2 is passed in step S41, the over-erase recovery write is performed on the over-erased memory cells bit by bit in steps S8 and S9.

When it is determined from the reading in step S8 that the memory cell is over-erased, the write pulse is applied to one memory cell, which is determined as the over-erased memory cell in step S9. As a result of repeating of steps S8 and S9, the write pulse is applied only to the memory cells having the threshold voltages lower than the verify voltage, and the threshold voltages of the memory cells receiving the write pulse shift to the higher side so that the memory cells are no longer in the over-erased state.

In the sixth embodiment, the soft writing is effected only on the memory cells connected to the selected word line. Therefore, it is possible to reduce the number of the memory cells, which have the threshold voltages exceeding the allowable upper limit of the threshold voltage when the soft write verify is passed, as compared with the prior art. Therefore, it is possible to minimize the times of application of the erase pulse 2 required thereafter, and thus it is possible to reduce the memory cells to be course processed by the over-erase recovery writing. Therefore, the erasing operation can be performed fast.

[Seventh Embodiment]

A seventh embodiment modifies a control flow of the sixth embodiment illustrated in FIGS. 17 and 18 to reduce further the block erasing time.

Figure 20:
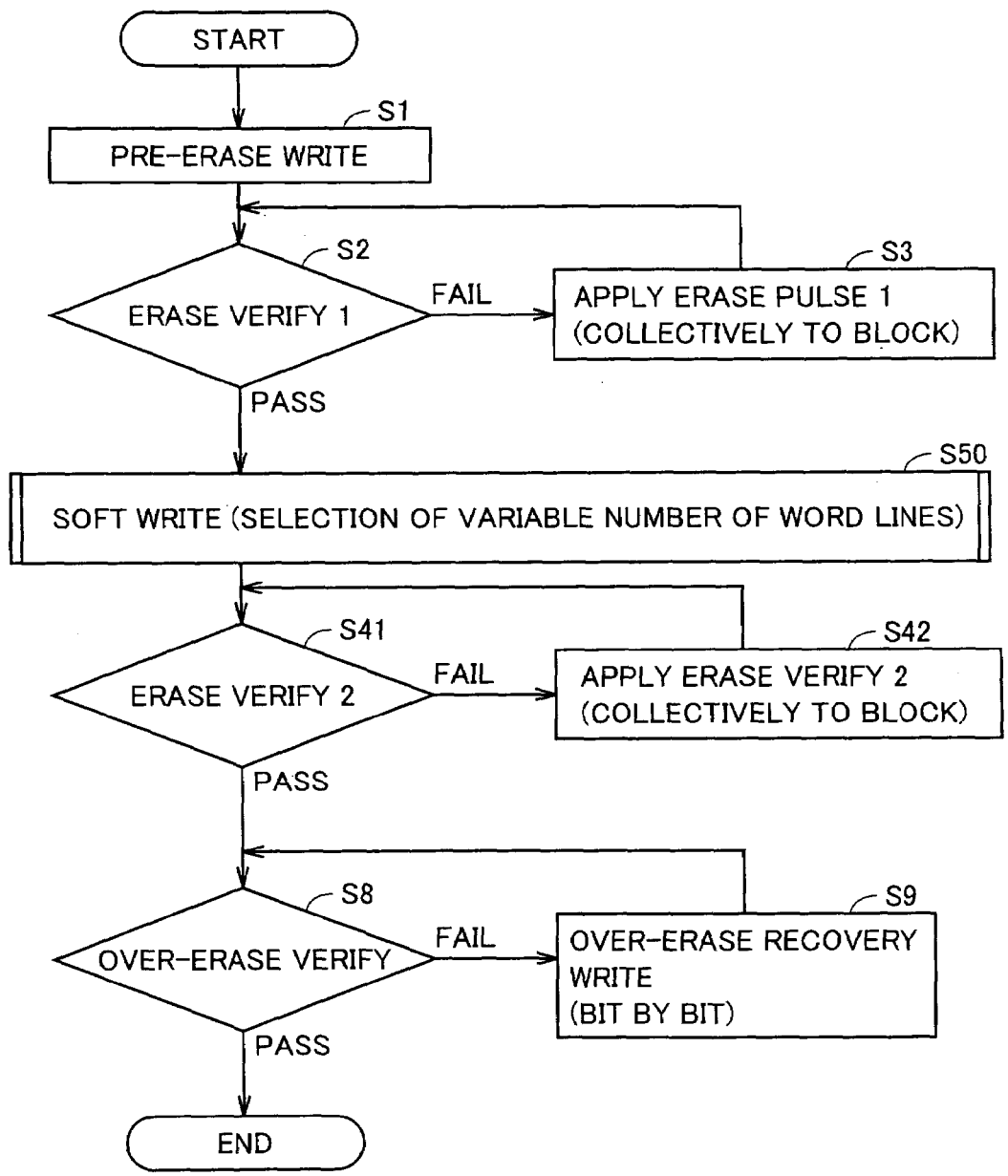
FIG. 20 is a flowchart illustrating a block erasing operation in a seventh embodiment.

FIG. 20 is a flowchart for illustrating an operation of block erasing according to the seventh embodiment.

Referring to FIG. 20, the flowchart of the block erasing of the seventh embodiment differs from the flowchart of the block erasing of the sixth embodiment illustrated in FIG. 17 in that a step S50 is employed instead of step S40. Other steps are substantially the same as those in FIG. 17, and therefore description thereof is not repeated. In step S50, the number of the word lines, which are selected in the operation of applying the soft write pulse, are changed in accordance with the number of the pulses to be applied.

Figure 21:
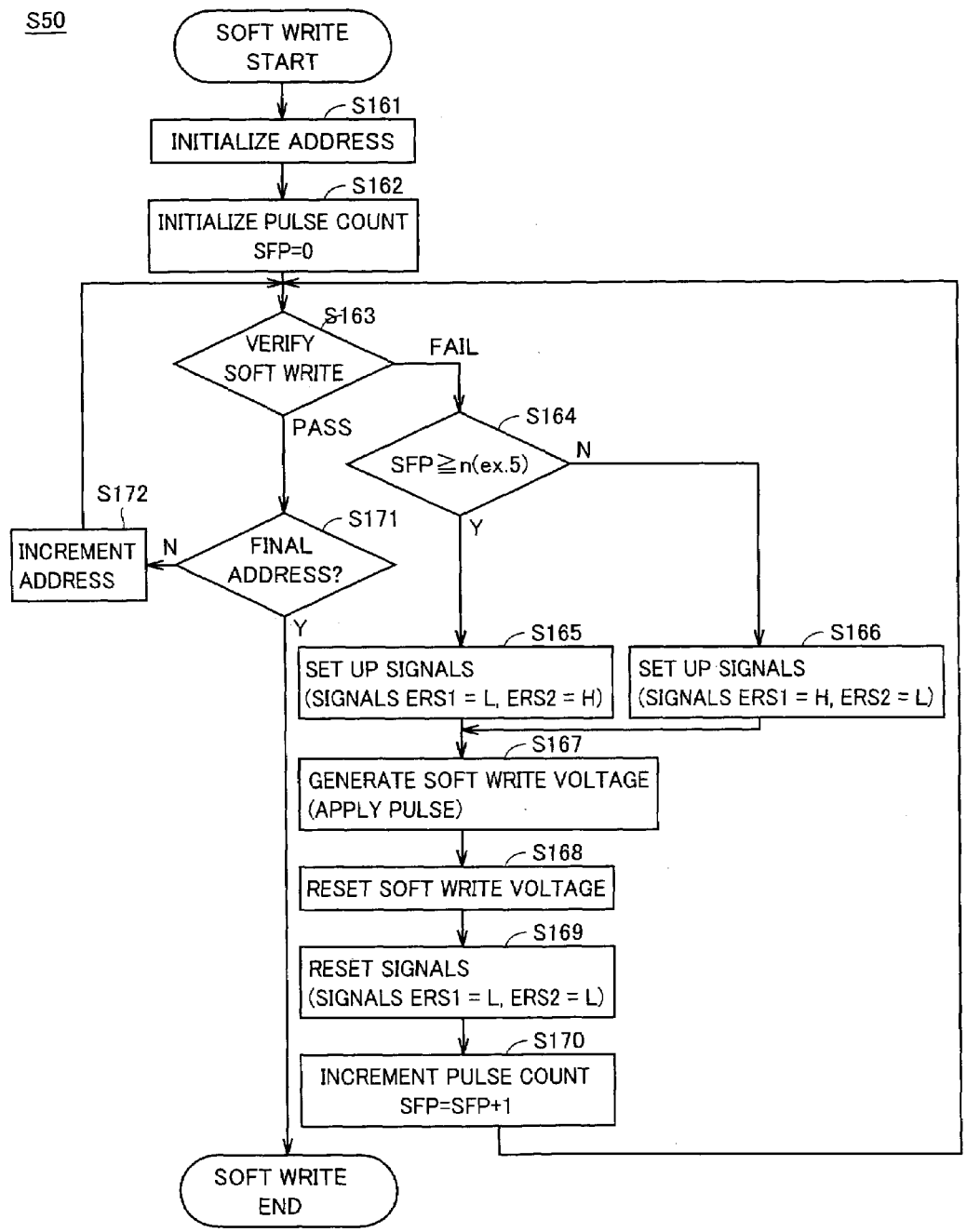
FIG. 21 is a flowchart for specifically illustrating an operation in a step S50 shown in FIG. 20.
Figure 22:
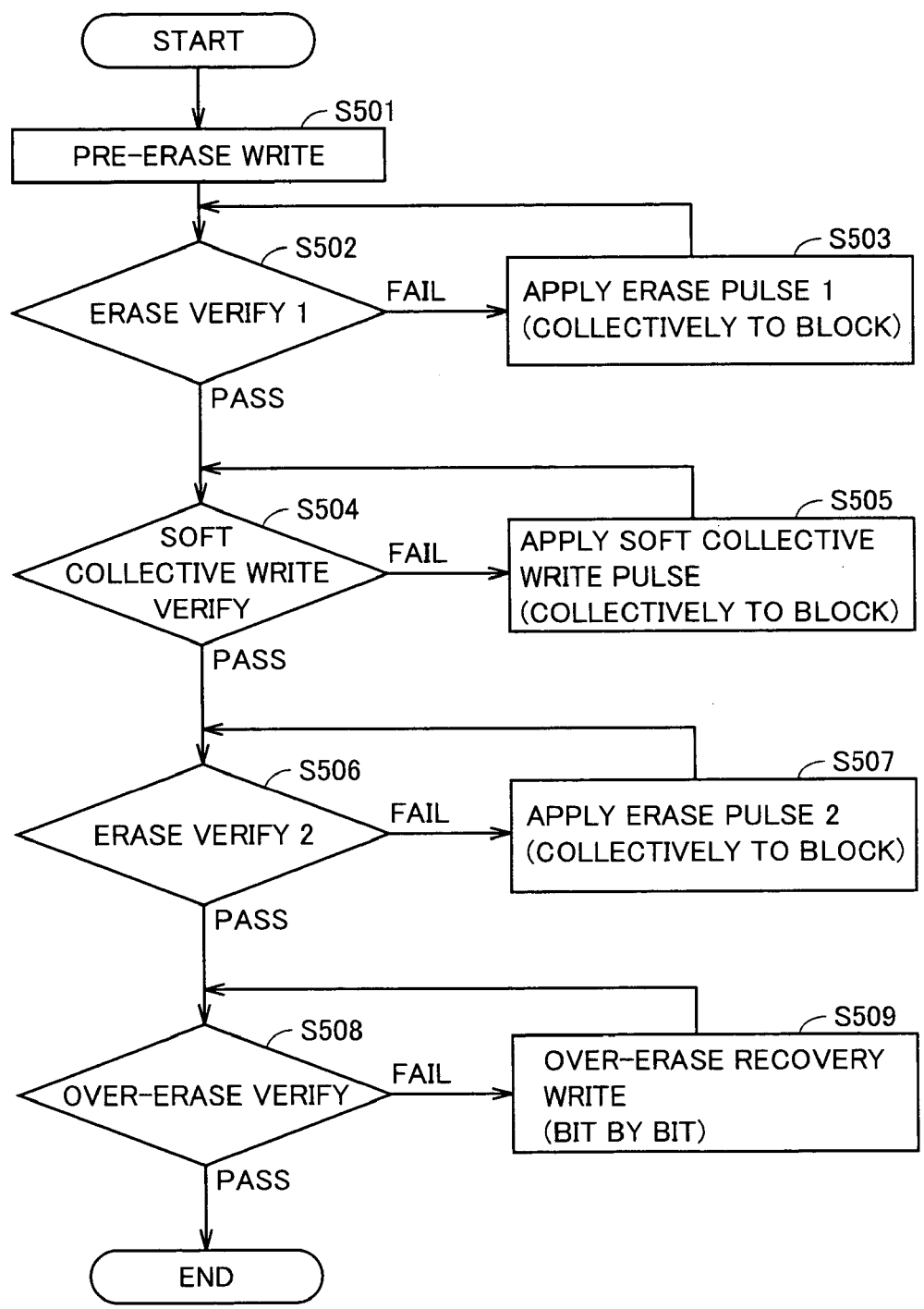
FIG. 22 is a flowchart illustrating a conventional block erasing operation of a flash memory.

FIG. 21 is a flowchart for illustrating a specific operation in step S50 shown in FIG. 20.

Referring to FIG. 21, when the soft write operation starts in step S50, the address is first initialized in a step S161. In a next step S162, a count of the applied soft write pulses is initialized. For example, write and erase control portion 2 manages this pulse count as a count SFP. In this case, count SFP is set to zero.

In a next step S163, data is read from the memory cell corresponding to the currently set address. The soft write verify is performed to determine whether the soft writing is already effected on this memory cell or not.

If the verify is failed in step S163, the operation moves to a step S164. In step S164, it is determined whether count SFP of the soft write pulses applied in the soft write operation in step S50 is equal to or larger than a predetermined value or not. For example, this predetermined value may be five.

If the count SFP is smaller than five, the operation moves to a step S166, in which the set-up is performed. Thereby, signals ERS1 and ERS2 are set to the H- and L-levels, respectively. By this setting, the application of the soft write pulse is performed in a next step S167 in such a manner that the pulse is applied collectively to the memory block.

When it is determined in step S164 that pulse count SFP is equal to or larger than the predetermined value, the operation moves to step S165. In step S165, set-up of the signal is performed so that signals ERS1 and ERS2 are set to the L- and H-levels, respectively. In this case, the soft write pulse is applied only to the memory transistors, which are present in a restricted region corresponding to the row address of the memory transistor verified in step S163, as already described in connection with the sixth embodiment.

In a step S167, the soft write pulse is applied to the region, which is set in steps S165 and S166. The soft write voltage is reset in step S168, and the signals are reset in a next step S169 so that both signals ERS1 and ERS2 attain the L-level.

In a next step S170, pulse count SFP is incremented. Thus, one is added to count SFP. When the pulse count is incremented in step S170, the operation moves to step S163, and the soft write verify is executed again by reading data from the memory transistors corresponding to the currently set address.

When the soft write verify is passed in step S163, the operation moves to a step S171, and it is determined whether the address of the memory transistor, which passed the verify, is the final address or not. If it is not the final address, the operation moves to a step S172, in which the address is incremented, and then the soft write verify is performed again in step S163.

If the address of the memory transistor, which passed the verify, is the final address in step S171, the soft write operation in step S50 ends.

According to the seventh embodiment, as described above, while the soft write pulses are small in number, all the word lines are selected. Thereby, the soft write pulse is applied collectively to the memory transistors in the block.

When the number of the soft write pulses increases to or above a predetermined number n (e.g., 5), the word lines are divided into multiple groups for applying the soft write pulse. Thereby, the soft write pulse application is simultaneously effected on the multiple bits, and thereby it is possible to suppress the total times of the soft write pulse application. The soft write pulse is further applied to only the word line including the bits, of which soft writing cannot be achieved by the previous soft write pulse. Thus, it is possible to optimize the region, on which the soft write pulse is applied.

As compared with the conventional manner, therefore, it is possible to reduce the number of the memory cells, which have the threshold voltages exceeding the allowable higher limit of the threshold voltage when the soft write verify is passed. Therefore, the times of subsequent application of the erase pulse 2 can be minimized, and this can reduce the number of the memory cells to be subjected to the over-erase recovery writing, and thus allows fast erasing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a memory block including a plurality of memory transistors arranged in rows and columns, and each having a control gate and a floating gate, a plurality of word lines arranged corresponding to rows of said plurality of memory transistors, respectively, and a plurality of bit lines arranged corresponding to the columns of said plurality of memory cells, respectively;
   a select circuit selecting an application target of an erase pulse in said memory block; and
   a write erase control portion controlling data erasing in said memory block when information held by said memory block is to be collectively erased, wherein
   said collective erasing provides states including:
   a first erased state attained at a midpoint in a course of the collective erasing, and
   a second erased state attained after said first erased state,
   said first and second erased states exhibit a distribution of threshold voltages of said plurality of memory transistors lower than predetermined first and second threshold voltages, respectively, and
   said write erase control portion instructs said select circuit,
   to select collectively the memory transistors in said memory block for repetitively applying a first erase pulse until said memory block enters said first erased state,
   to perform selection such that a write pulse weaker than a write pulse for usual writing is applied to the memory transistor in said memory block after said memory block enters said first erased state, and
   to perform selection such that said memory block is divided into a plurality of regions, and said regions are successively selected to apply a second erase pulse collectively to each of said regions until said memory block enters said second erased state.

2. The nonvolatile semiconductor memory device according to claim 1, wherein
   said select circuit operates in accordance with an instruction of said write erase control portion to select collectively said plurality of word lines in an operation of applying said first erase pulse, and to select collectively a part of said plurality of word lines in an operation of applying said second erase pulse.

3. The nonvolatile semiconductor memory device according to claim 2, wherein
   said write erase control portion performs a verify operation of reading data from said memory block while successively changing row and column addresses, and determining whether said memory block is in said second erased state or not, and instructs said select circuit to apply said second erase pulse to the memory transistor connected to said part of the word lines every time a result of said verify operation exhibits failing, and
   said write erase control portion instructs said select circuit such that said part of the word lines include the word line corresponding to a row address designated when the result of said verify operation exhibits the failing.

4. The nonvolatile semiconductor memory device according to claim 1, wherein
   said write erase control portion operates, in an operation of applying said first erase pulse, to apply data for collectively erasing said plurality of bit lines, and operates, in an operation of applying said second erase pulse, to apply said data for erasing to a part of said plurality of bit lines.

5. The nonvolatile semiconductor memory device according to claim 4, wherein
   said write erase control portion performs a verify operation of reading data from said memory block while successively changing row and column addresses, and determining whether said memory block is in said second erased state or not, and instructs said select circuit to apply said second erase pulse to the memory transistor connected to said part of the bit lines every time a result of said verify operation exhibits failing, and
   said write erase control portion instructs said select circuit such that said part of the bit lines include the bit line corresponding to a column address designated when the result of said verify operation exhibits the failing.

6. The nonvolatile semiconductor memory device according to claim 1, wherein
   said select circuit operates in accordance with an instruction of said write erase control portion to select collectively said plurality of word lines in an operation of applying said first erase pulse, to select collectively said plurality of word lines in an operation of applying said second erase pulse when times of application of said second erase pulse are lower than a predetermined number, and to select collectively a part of said plurality of word lines in said operation of applying said second erase pulse when the times of application of said second erase pulse are equal to or larger than the predetermined number.

7. The nonvolatile semiconductor memory device according to claim 6, wherein
   said write erase control portion performs a verify operation of reading data from said memory block while successively changing row and column addresses, and determining whether said memory block is in said second erased state or not, and instructs said select circuit to apply said second erase pulse to the memory transistor connected to the word line selected by said select circuit every time a result of said verify operation exhibits failing, and said write erase control portion instructs said select circuit such that said part of the word lines include the word line corresponding to a row address designated when the result of said verify operation exhibits the failing.

8. The nonvolatile semiconductor memory device according to claim 1, wherein
said second threshold voltage is higher than said first threshold voltage.

9. A nonvolatile semiconductor memory device comprising:
a memory block including a plurality of memory transistors arranged in rows and columns, and each having a control gate and a floating gate, a plurality of word lines arranged corresponding to rows of said plurality of memory transistors, respectively, and a plurality of bit lines arranged corresponding to the columns of said plurality of memory cells, respectively;
a select circuit selecting an application target of an erase pulse in said memory block; and
a write erase control portion controlling data erasing in said memory block when information held by said memory block is to be collectively erased, wherein
said collective erasing provides states including:
a first erased state attained at a midpoint in a course of the collective erasing, and
a second erased state attained after said first erased state,
said first and second erased states exhibit a distribution of threshold voltages of said plurality of memory transistors lower than predetermined first and second threshold voltages, respectively,
a first written state exhibits the distribution of the threshold voltages of said plurality of memory cells exceeding a predetermined threshold voltage lower than said first threshold voltage, and
said write erase control portion instructs said select circuit:
to select collectively the memory transistors in said memory block for repetitively applying a first erase pulse until said memory block enters said first erased state,
to perform division of said memory block into a plurality of regions, and successively selection of said respective regions for applying a write pulse weaker than a write pulse for usual writing collectively to each of said regions after said memory block enters said first erased state, and
to select collectively the memory transistors in said memory block for applying a second erase pulse to said memory block until said memory block enters said second erased state.

10. The nonvolatile semiconductor memory device according to claim 9, wherein
said select circuit operates in accordance with an instruction of said write erase control portion to select collectively said plurality of word lines in an operation of applying said first erase pulse, and to select collectively a part of said plurality of word lines in an operation of applying said write pulse weaker than the write pulse for usual writing.

11. The nonvolatile semiconductor memory device according to claim 10, wherein
said write erase control portion performs a verify operation of reading data from said memory block while successively changing row and column addresses, and determining whether said memory block is in said first written state or not, and instructs said select circuit to apply said write pulse weaker than the write pulse for usual writing to the memory transistor connected to said part of the word lines every time a result of said verify operation exhibits failing, and
said write erase control portion instructs said select circuit such that said part of the word lines include the word line corresponding to a row address designated when the result of said verify operation exhibits the failing.

12. The nonvolatile semiconductor memory device according to claim 9, wherein
said select circuit operates in accordance with an instruction of said write erase control portion to select collectively said plurality of word lines in an operation of applying said first erase pulse,
to select collectively said plurality of word lines in an operation of applying said write pulse weaker than the write pulse for usual writing when times of application of said write pulse are lower than a predetermined number, and to select collectively a part of said plurality of word lines in said operation of applying said write pulse weaker than the write pulse for usual writing when the times of application of said write pulse are equal to or larger than the predetermined number.

13. The nonvolatile semiconductor memory device according to claim 12, wherein
said write erase control portion performs a verify operation of reading data from said memory block while successively changing row and column addresses, and determining whether said memory block is in said first written state or not, and instructs said select circuit to apply said write pulse weaker than the write pulse for usual writing to the memory transistor connected to the word line selected by said select circuit every time a result of said verify operation exhibits failing, and
said write erase control portion instructs said select circuit such that said part of the word lines include the word line corresponding to a row address designated when the result of said verify operation exhibits the failing.

* * * * *